(12) United States Patent
Cho et al.

(10) Patent No.: US 8,222,742 B2
(45) Date of Patent: Jul. 17, 2012

(54) SEMICONDUCTOR DEVICE

(75) Inventors: Hoo-Sung Cho, Yongin-si (KR);
Han-Soo Kim, Suwon-si (KR);
Jae-Hoon Jang, Seongnam-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 274 days.

(21) Appl. No.: 12/457,290

(22) Filed: Jun. 5, 2009

(65) Prior Publication Data

US 2009/0315187 A1 Dec. 24, 2009

(30) Foreign Application Priority Data

Jun. 19, 2008 (KR) ........................ 10-2008-0057963

(51) Int. Cl.
*H01L 23/48* (2006.01)
(52) U.S. Cl. ................. 257/773; 257/E23.145; 438/618
(58) Field of Classification Search .......... 257/734–783, 257/E23.145; 438/618, 666
See application file for complete search history.

(56) References Cited

U.S. PATENT DOCUMENTS 7,005,350 B2   2/2006   Walker et al.
2007/0176214 A1*  8/2007   Kwon et al. .................. 257/250

FOREIGN PATENT DOCUMENTS

KR   10-2006-0098045 A   9/2006
KR   10-2007-0078453 A   8/2007

* cited by examiner

*Primary Examiner* — Tony Tran
(74) *Attorney, Agent, or Firm* — Lee & Morse, P.C.

(57) ABSTRACT

A semiconductor device includes a lower semiconductor layer with first conductive regions and including at least one dummy first conductive region, an upper semiconductor layer with second conductive regions on the lower semiconductor layer and including at least one dummy second conductive region, a penetration hole in the upper semiconductor layer and penetrating the dummy second conductive region and the upper semiconductor layer under the dummy second conductive region, a lower conductive line on the lower semiconductor layer and electrically connected to the first conductive regions, an upper conductive line on the upper semiconductor layer and electrically connected to the second conductive regions, and a first conductive plug in the penetration hole between the lower conductive line and the upper conductive line, the first conductive plug electrically connecting the lower and upper conductive lines and being spaced apart from sidewalls of the penetration hole.

14 Claims, 42 Drawing Sheets

SEMICONDUCTOR DEVICE

BACKGROUND

1. Field

Exemplary embodiments disclosed herein relate to a semiconductor device, and more particularly, to a semiconductor device having a multilayer structure including a common source line.

2. Description of the Related Art

Semiconductor devices are required to be highly integrated to satisfy a superior performance and a low price. A flash memory of a multilayer structure has been introduced to increase an integration of a semiconductor device. For example, a conventional flash memory device may provide a lower semiconductor layer and an upper semiconductor layer on the lower semiconductor layer, and may include memory cell transistors on each of the upper and lower semiconductor layers.

SUMMARY

Embodiments are directed to a semiconductor device, which substantially overcomes one or more of the problems due to the limitations and disadvantages of the related art.

It is therefore a feature of an embodiment to provide a semiconductor device having a multilayer structure.

At least one of the above and other features and advantages may be realized by providing a semiconductor device, including a lower semiconductor layer in which first conductive regions including a dummy first conductive region are disposed, an upper semiconductor layer over the lower semiconductor layer, the upper semiconductor layer in which second conductive regions including a dummy second conductive region are disposed, a lower conductive line under the upper semiconductor layer, the lower conductive line electrically connected to the first conductive regions, an upper conductive line over the upper semiconductor layer, the upper conductive line electrically connected to the second conductive regions, and a first conductive plug between the lower conductive line and the upper conductive line, the first conductive plug electrically connecting the lower conductive region to the upper conductive line, wherein the upper semiconductor layer includes a penetration hole penetrating the dummy second conductive region and the upper semiconductor layer under the dummy second conductive region, and wherein the first conductive plug is spaced apart from a sidewall of the penetration hole and passes through the penetration hole.

The semiconductor device may further include a device isolation layer in the upper semiconductor layer, the device isolation layer separating each of the second conductive regions, first gate lines on the lower semiconductor layer on both sides of the lower conductive line, second gate lines along a first direction on the upper semiconductor layer on both sides of the upper conductive line, the second gate lines being spaced apart from each other along a second direction, wherein the penetration hole penetrates a portion of the device isolation layer at both sides of the dummy second conductive region and the upper semiconductor layer under the portion of the device isolation layer. The penetration hole may be between two gate lines adjacent to each other along the second direction, the penetration hole having a width along the second direction smaller than a distance between the two adjacent gate lines. The penetration hole may be between two second conductive regions adjacent to each other along the first direction, the penetration hole having a width along the first direction smaller than a distance between the two adjacent second conductive regions. The semiconductor device may further include second conductive plugs between the upper conductive line and the second conductive regions, and an interlayer insulating layer between the upper semiconductor layer and the lower semiconductor layer, the interlayer insulating layer having an extension hole extending from the penetration hole and penetrating at least a portion of the interlayer insulating layer. The penetration hole may be wider than the extension hole.

The first conductive plug may fill the penetration hole and the extension hole to contact a portion of the lower conductive line, the upper conductive line being in contact with a top surface of the second conductive regions, and the upper conductive line and the first conductive plug being integral with each other. The semiconductor device may further include an etching stop pattern disposed between the first conductive plug and the sidewall of the penetration hole. A plurality of dummy first conductive regions is disposed adjacent to one another along the first direction, and a plurality of the dummy second conductive regions is disposed adjacent to one another along the first direction. The penetration hole may penetrate a dummy second conductive region and a portion of a device isolation layer, the portion of the device isolation layer being between two adjacent second conductive regions. The penetration hole may penetrate a portion of the device isolation layer adjacent to both outmost sides of the adjacent dummy second conductive regions and the upper semiconductor layer under the portion of the device isolation layer. The semiconductor device may further include a plurality of first conductive plugs in the penetration hole, the plurality of the first conductive plugs being spaced apart from each other along a first direction. The penetration hole, upper conductive line, and lower conductive line may overlap. A width of the first conductive plug may be smaller than a width of the penetration hole, the first conductive plug being centered in the penetration hole. The first conductive plug may contact the upper and lower conductive lines, the upper conductive line and the first conductive plug being equipotential.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
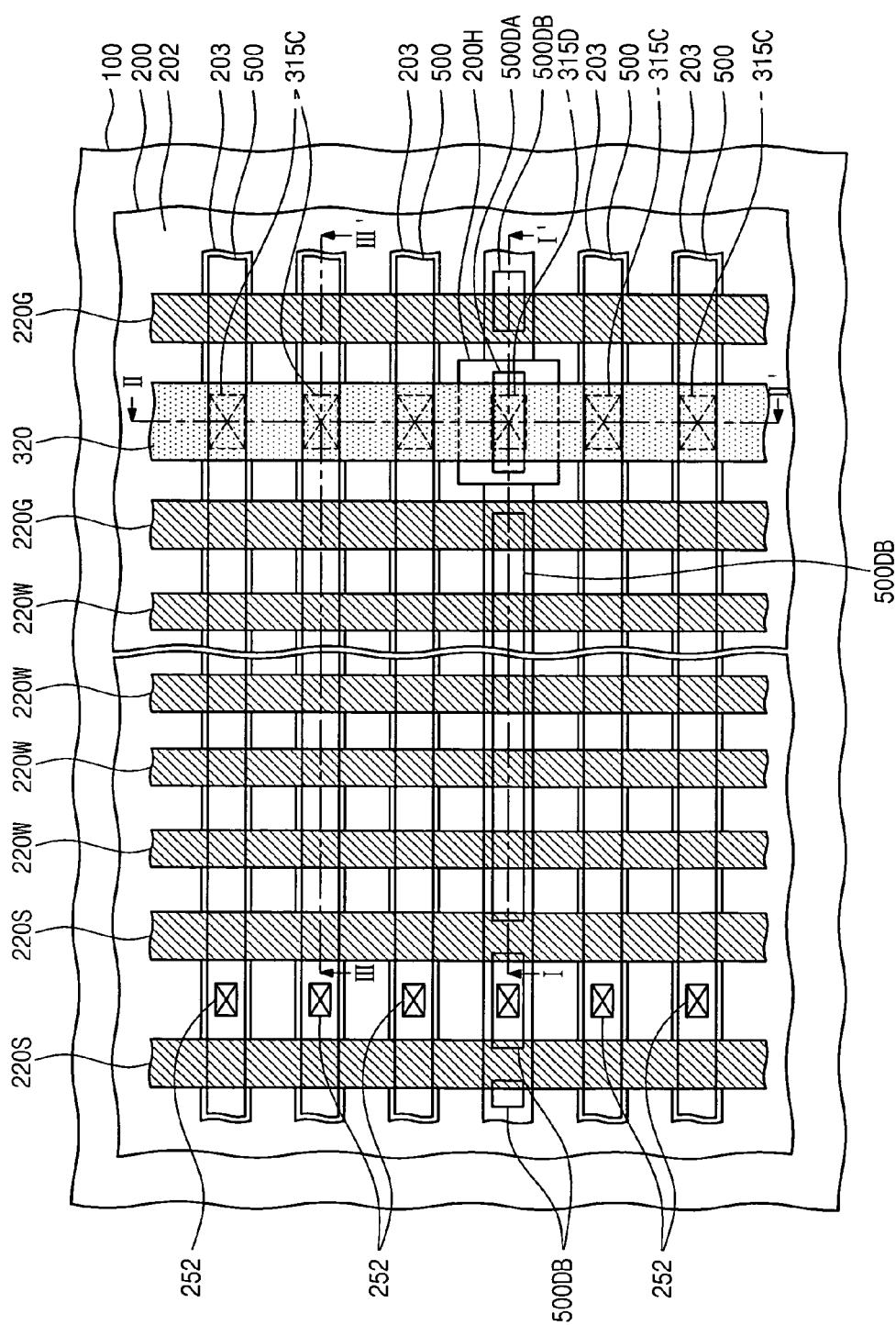
FIG. 1 illustrates a top plan view of a semiconductor device according to an embodiment of the present invention.

Korean Patent Application No. 10-2008-0057963, filed on Jun. 19, 2008, in the Korean Intellectual Property Office, and entitled: "Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer is referred to as being "between" two layers, it can be the only layer between the two layers, or one or more intervening layers may also be present. In addition, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or intervening layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is substantially orthogonal to a surface of a substrate supporting the substrate.

Figure 2A:
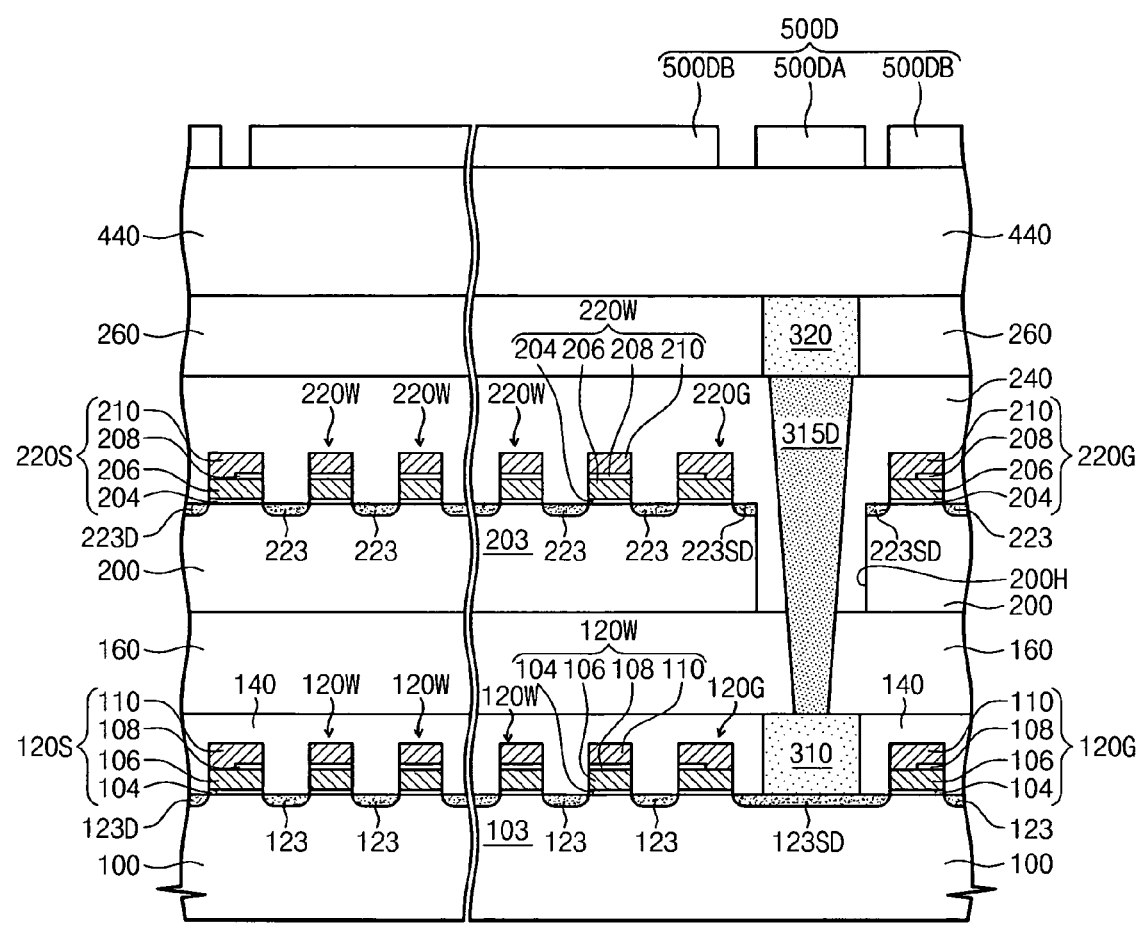
FIG. 2A illustrates a cross sectional view along line I-I' of FIG. 1.
Figure 2B:
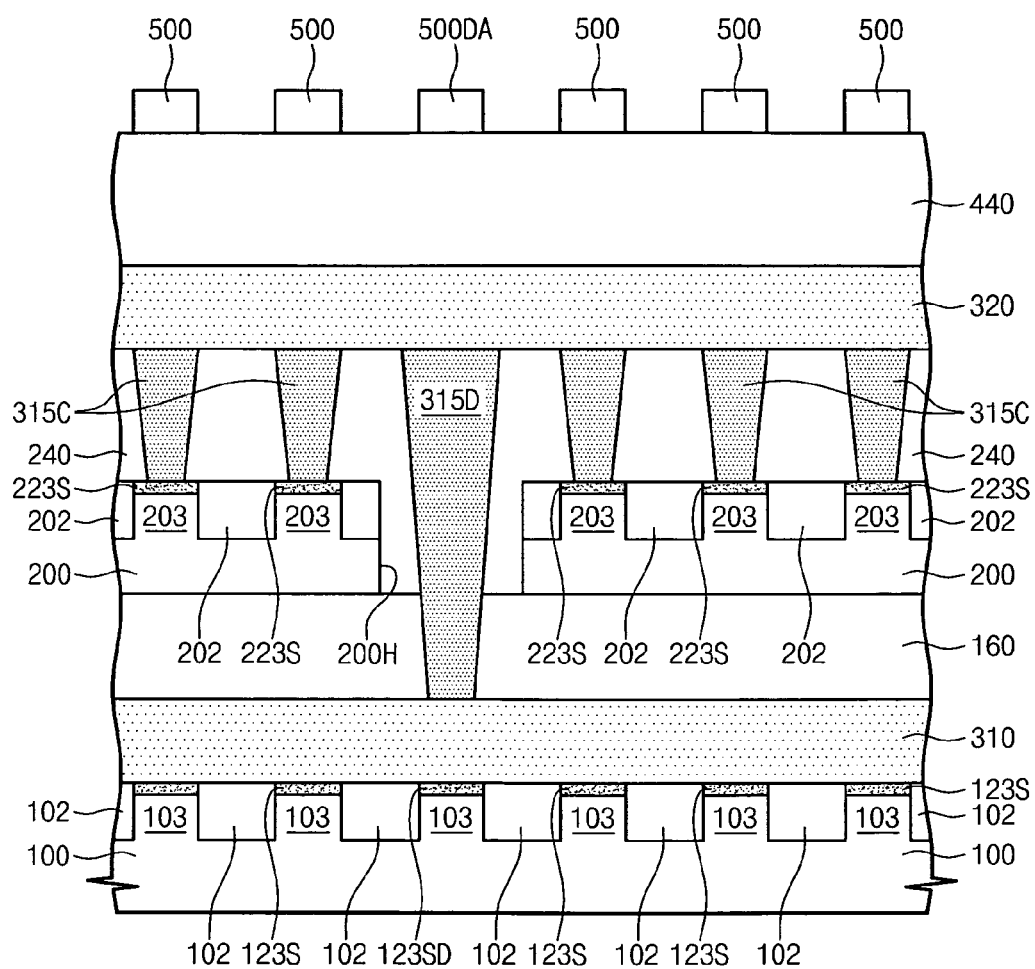
FIG. 2B illustrates a cross sectional view along the II-II' of FIG. 1.
Figure 2C:
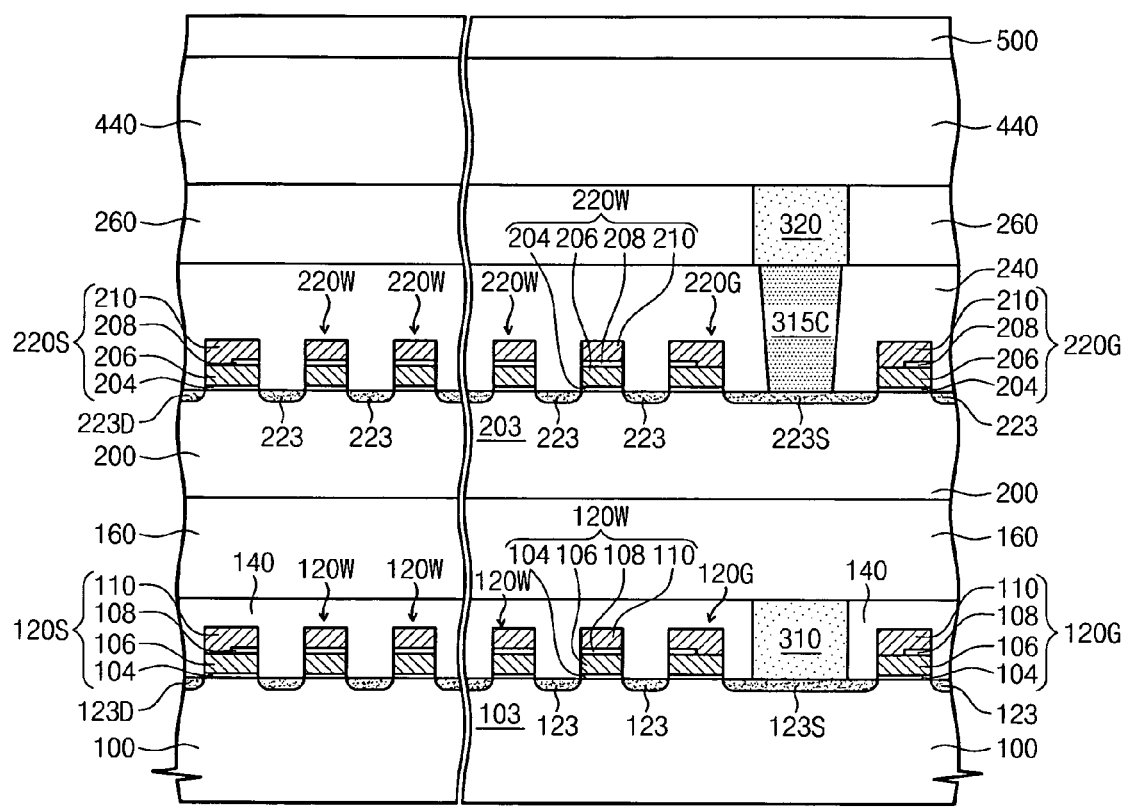
FIG. 2C illustrates a cross sectional view along line III-III' of FIG. 1.
Figure 3A:
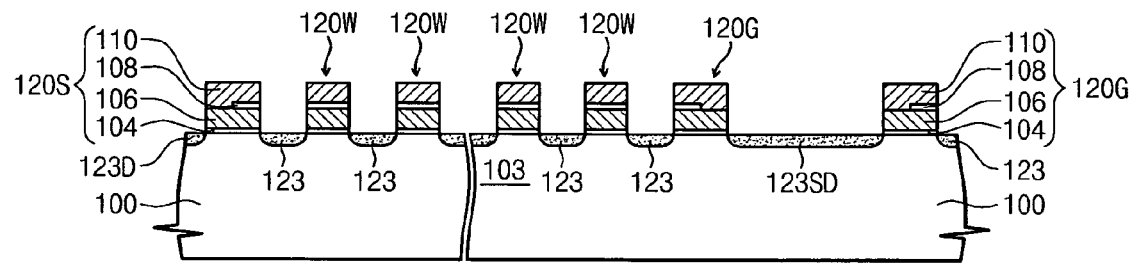
FIGS. 3A through 3F illustrate cross sectional views along line I-I' of FIG. 1 to illustrate stages in a method of manufacturing a semiconductor device according to an embodiment of the present invention.
Figure 3B:
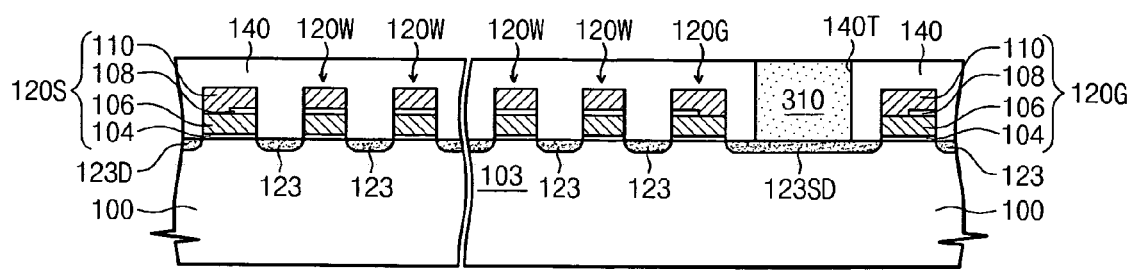
Figure 3C:
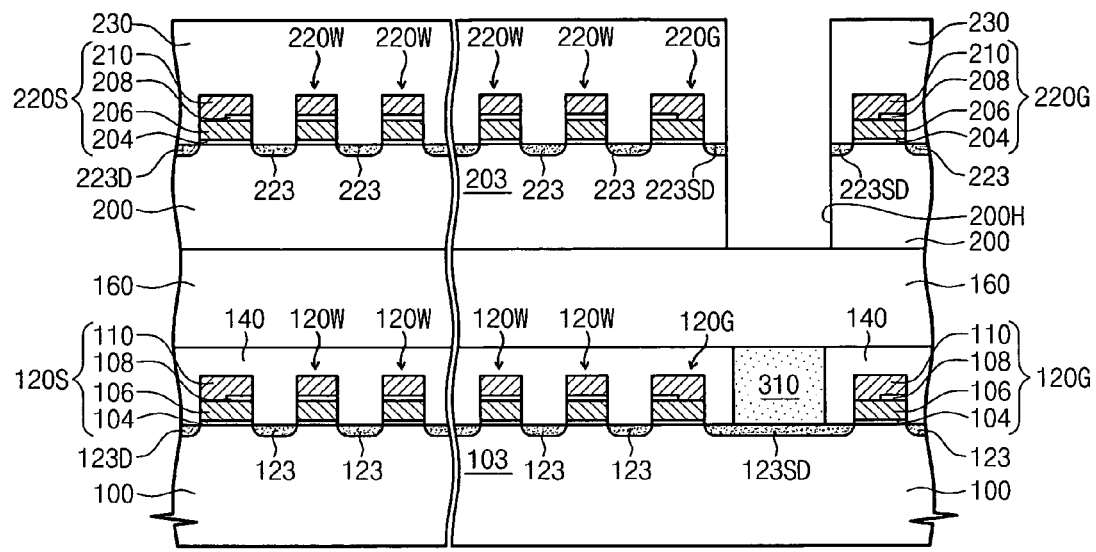
Figure 3D:
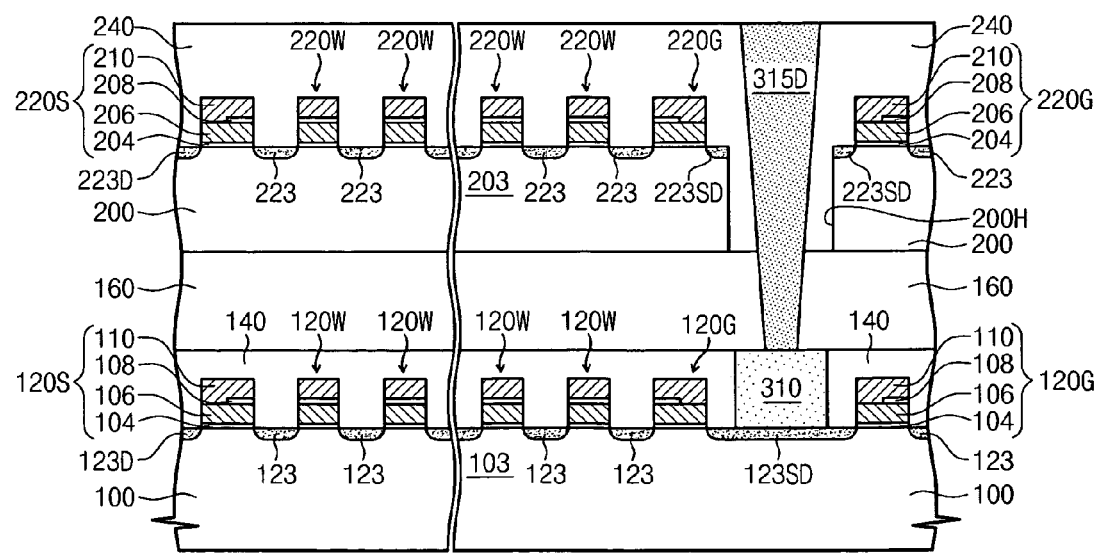
Figure 3E:
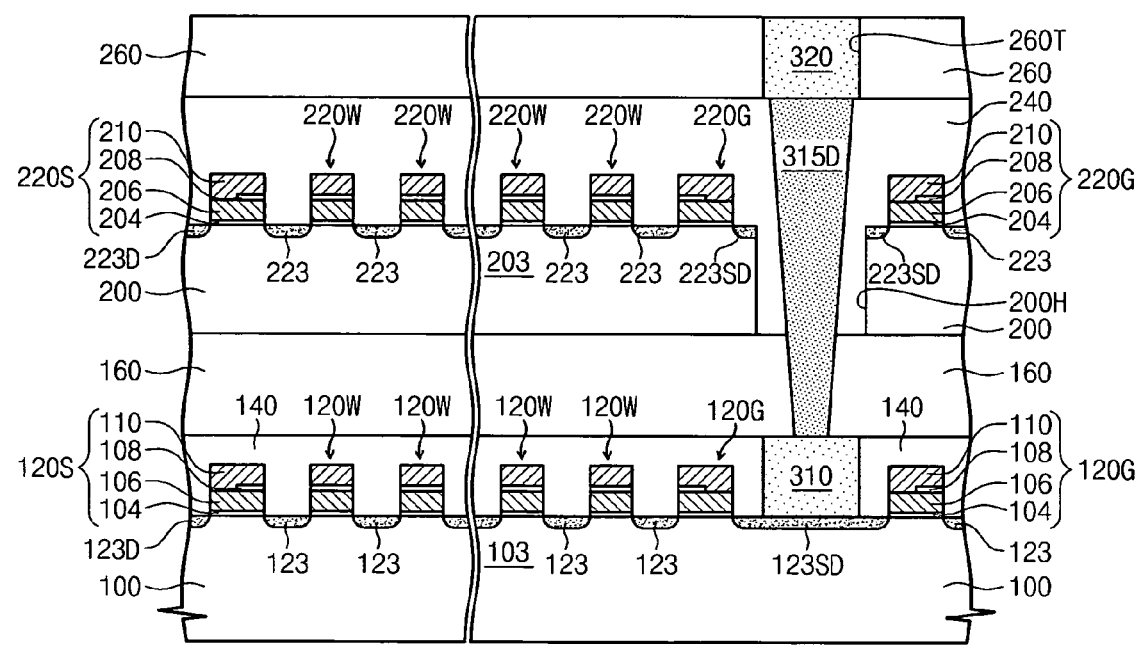
Figure 3F:
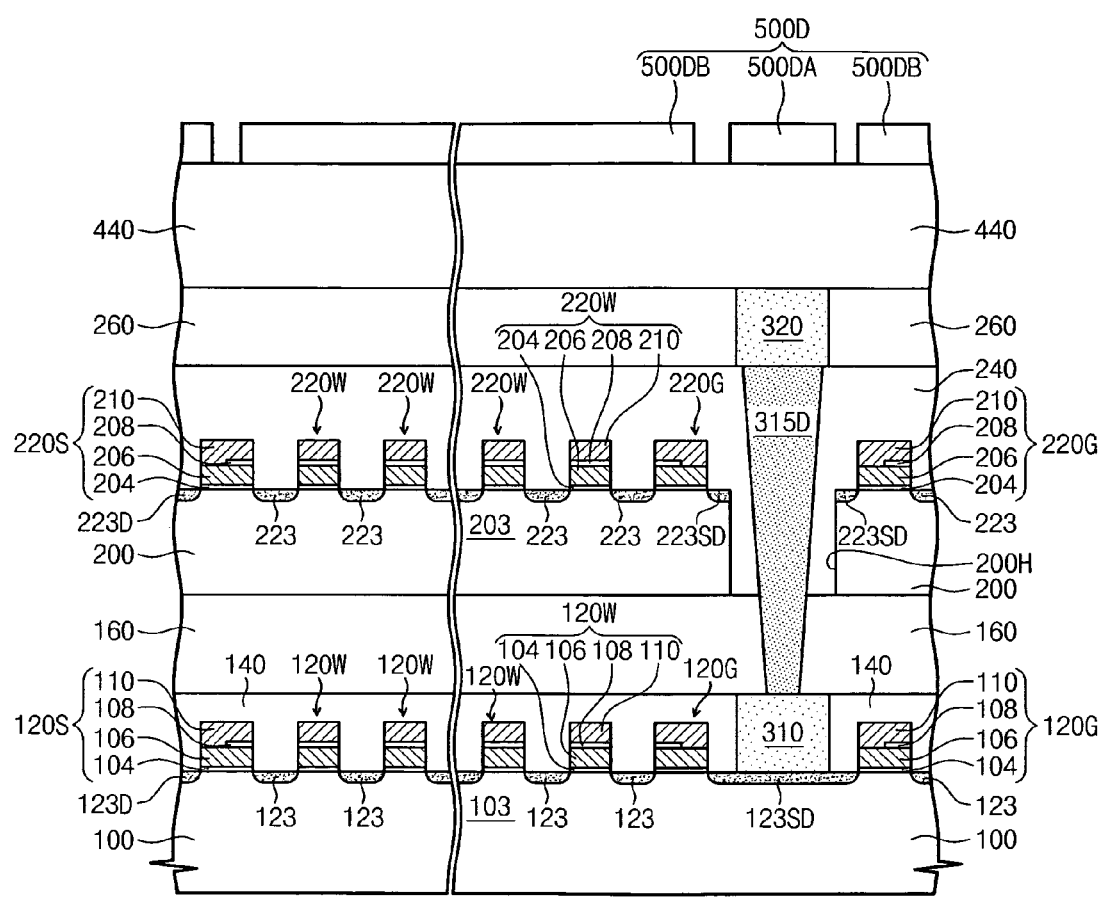
Figure 4A:
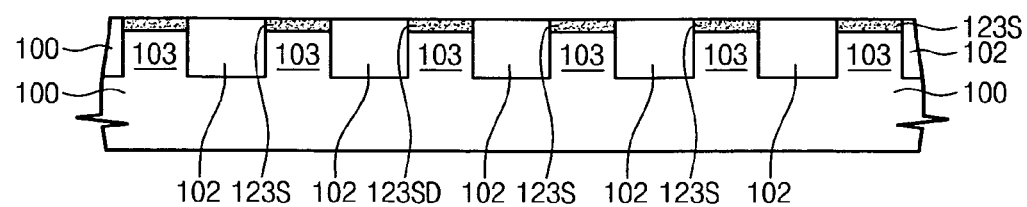
FIGS. 4A through 4F illustrate cross sectional views along line II-II' of FIG. 1 to illustrate stages in a method of manufacturing a semiconductor device according to an embodiment of the present invention.
Figure 4B:
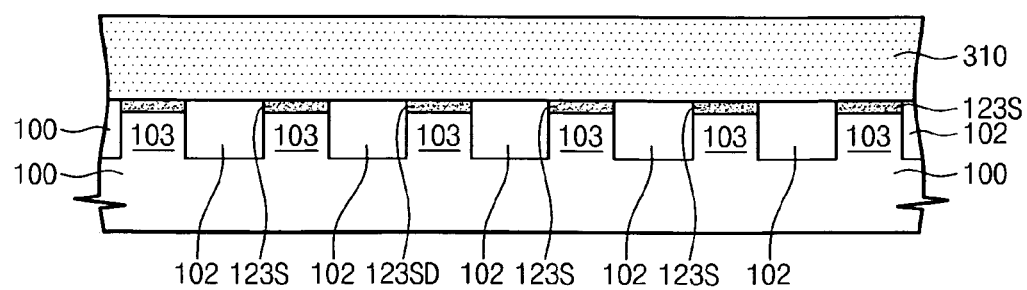
Figure 4C:
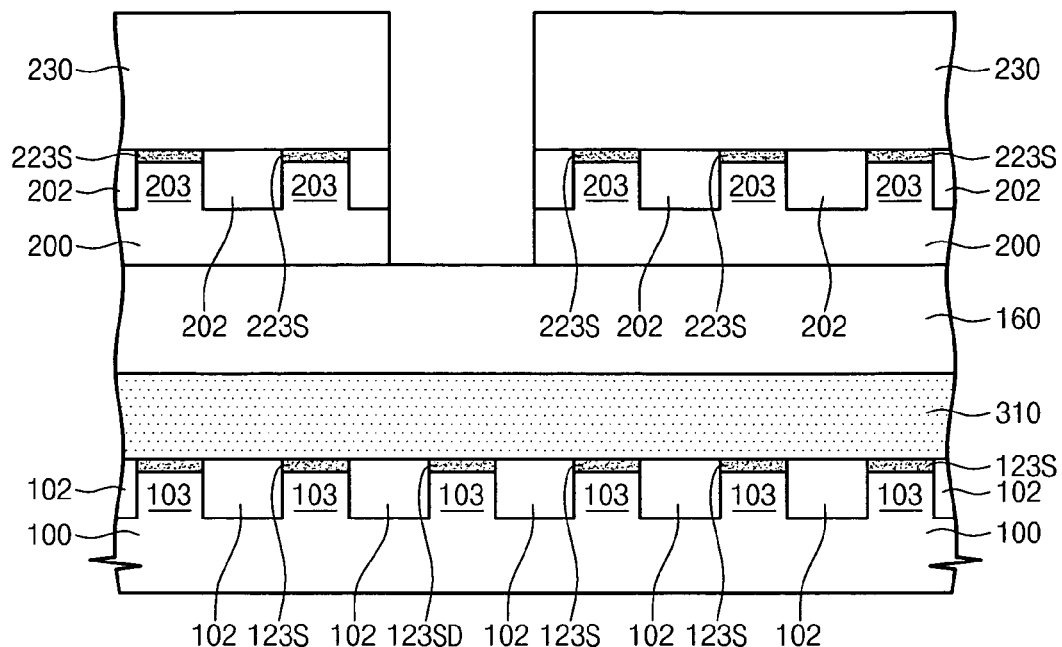
Figure 4D:
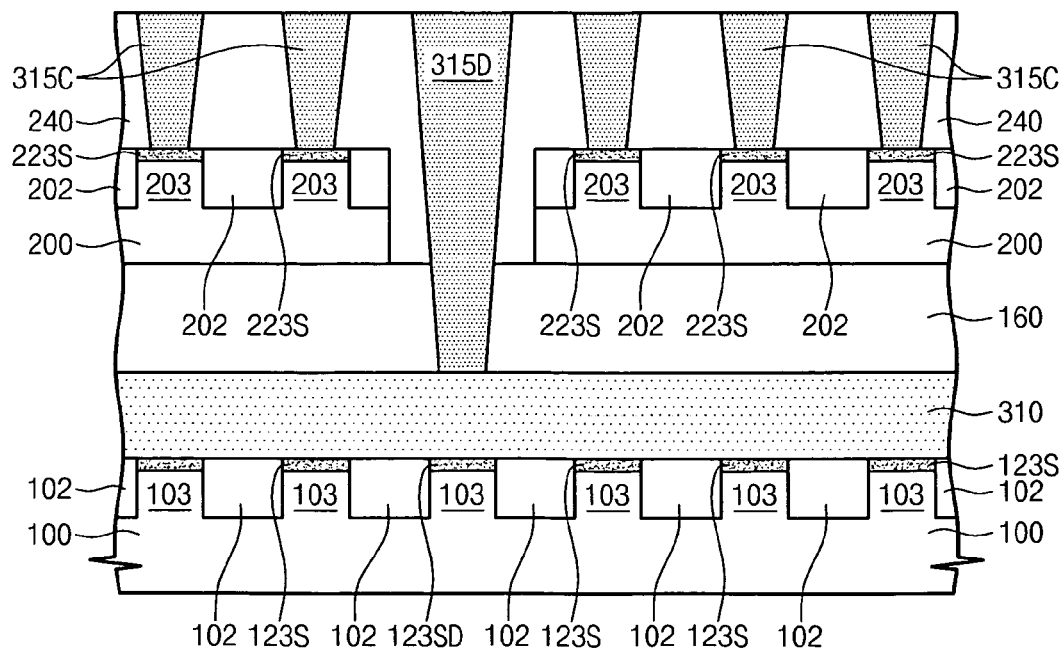
Figure 4E:
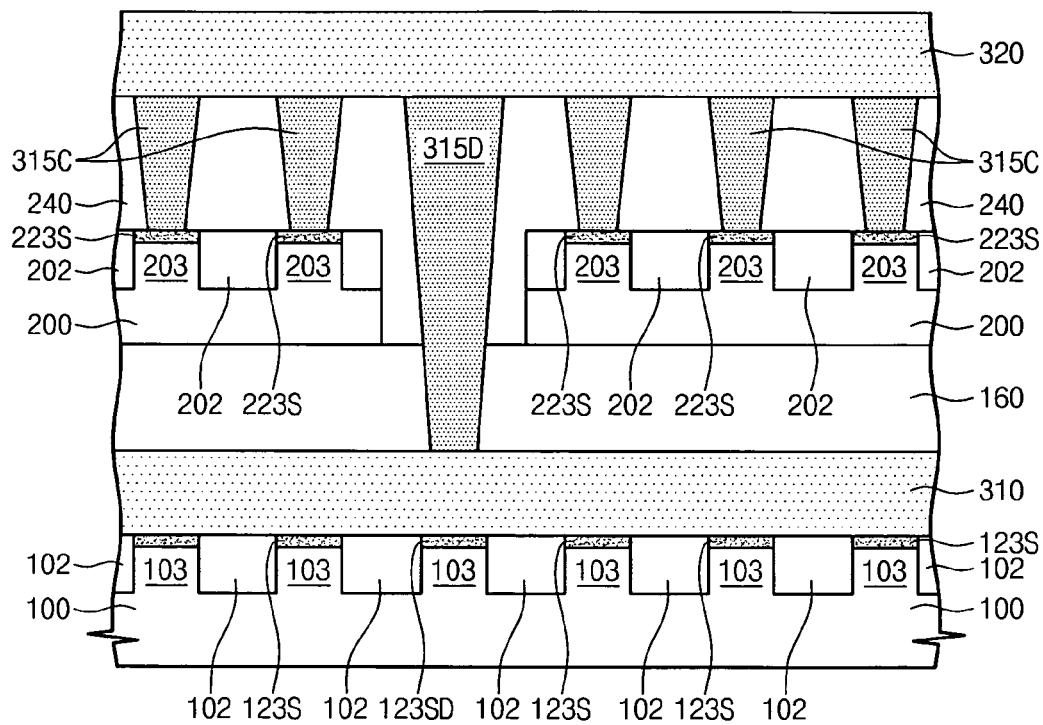
Figure 4F:
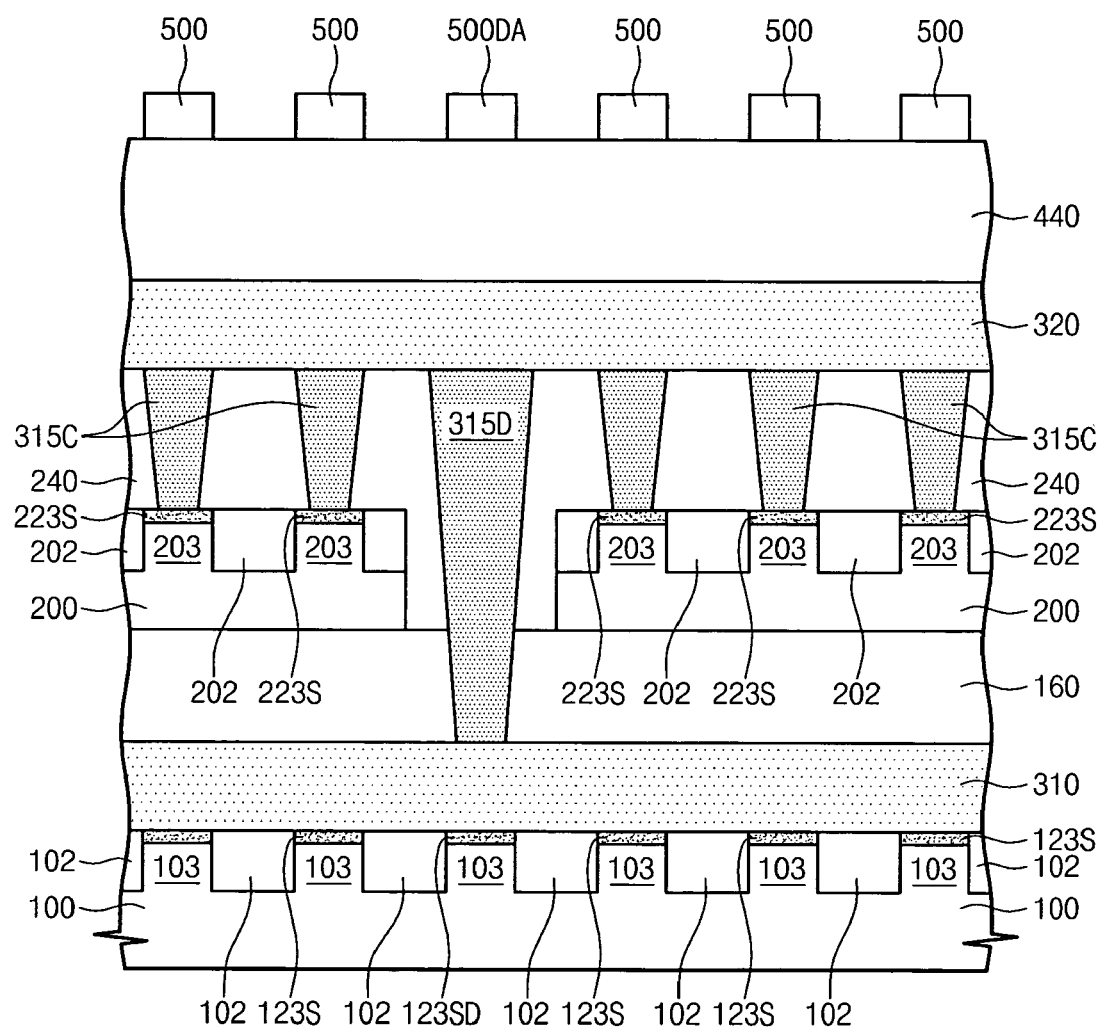
Figure 5A:
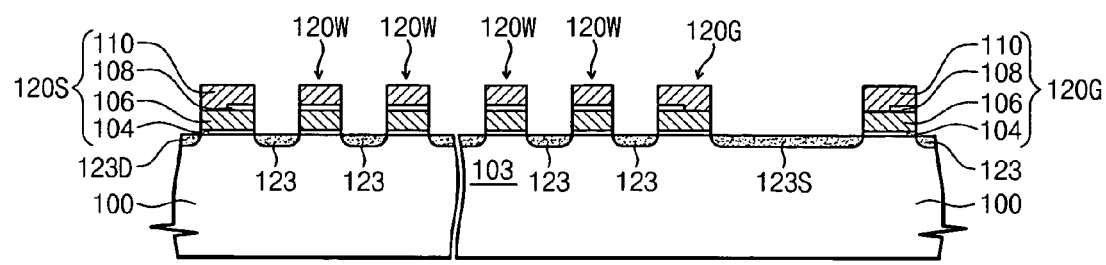
FIGS. 5A through 5F illustrate cross sectional views along line III-III' of FIG. 1 to illustrate stages in a method of manufacturing a semiconductor device according to an embodiment of the present invention.
Figure 5B:
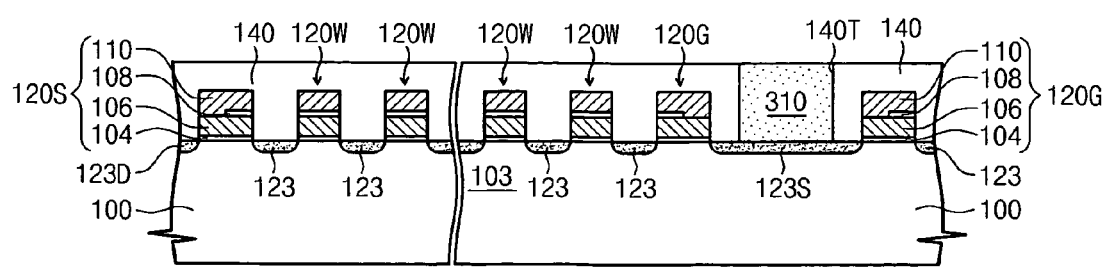
Figure 5C:
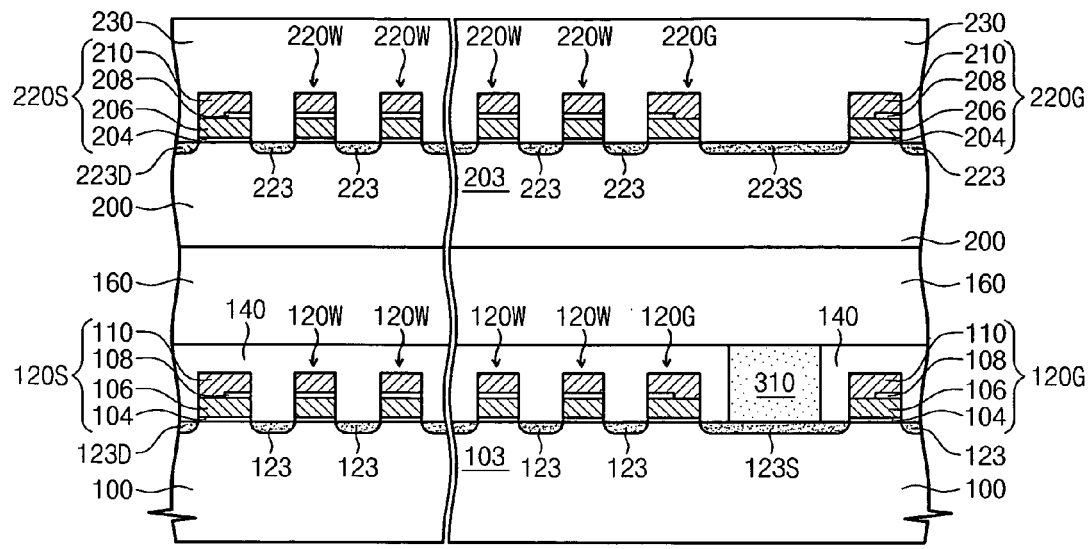
Figure 5D:
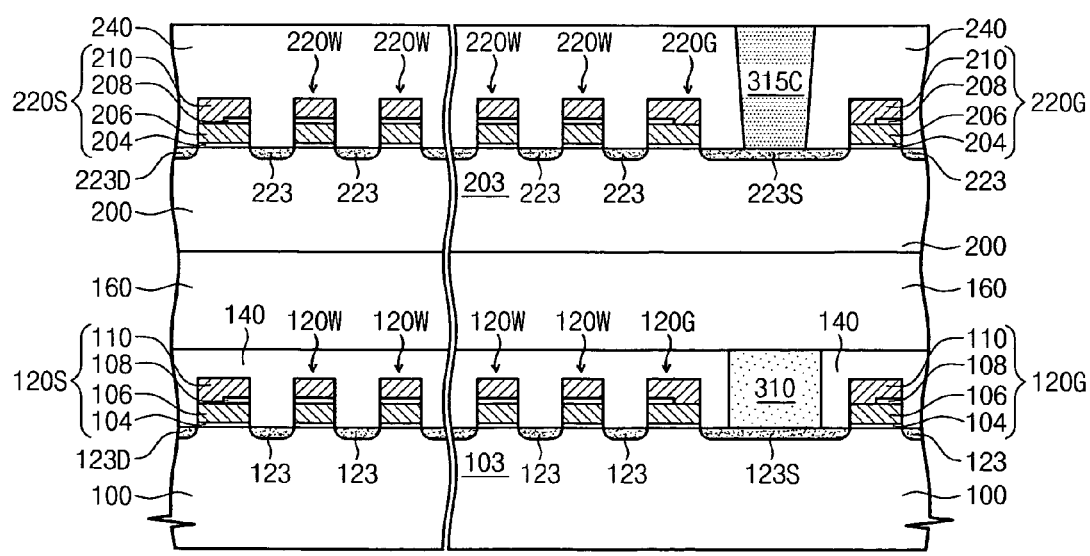
Figure 5E:
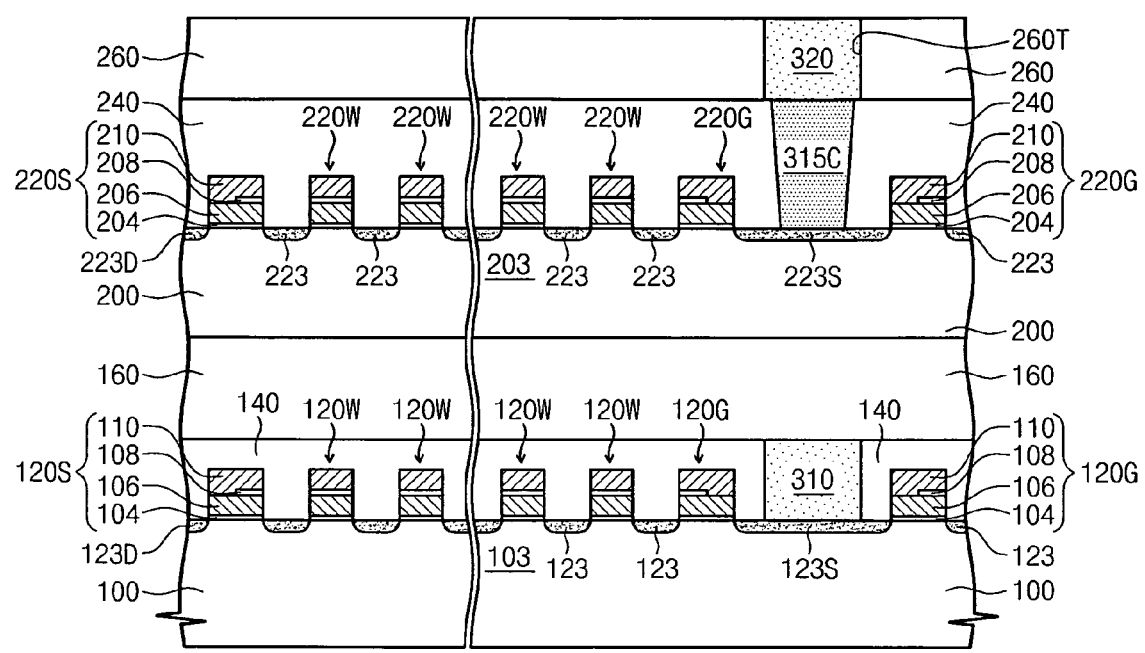
Figure 5F:
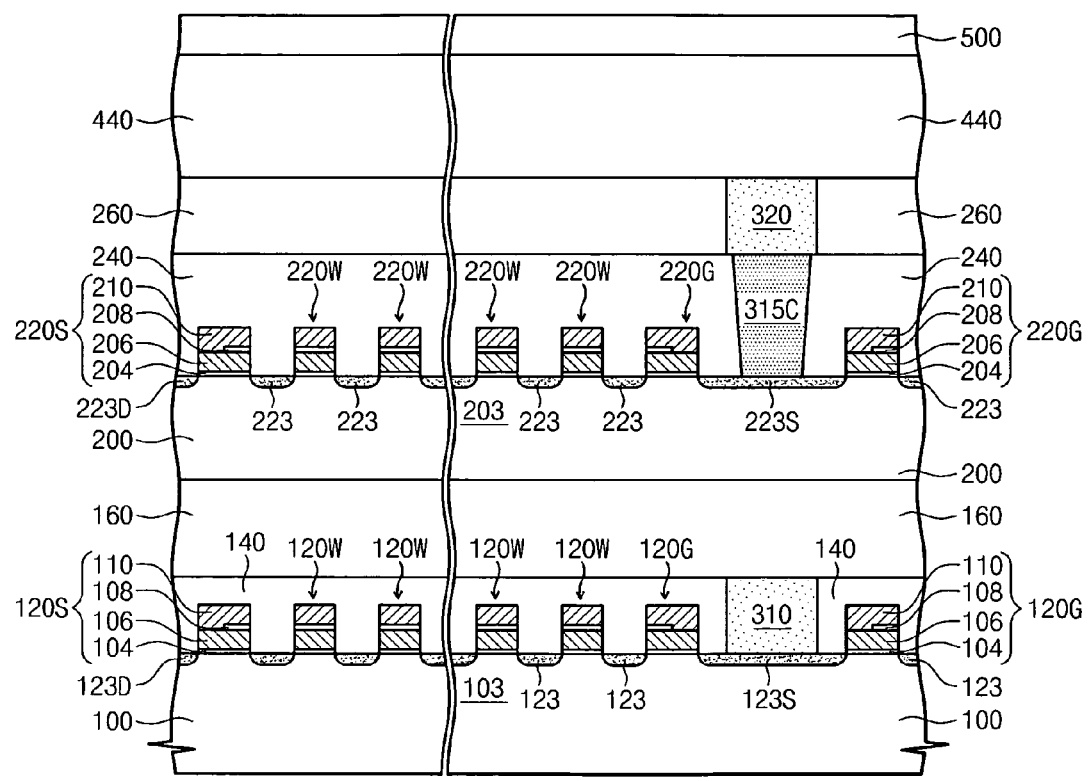

Referring to FIGS. 1, 2A, 2B, and 2C, a semiconductor device according to a first embodiment of the present invention will be described. FIG. 1 illustrates a top plan view of a semiconductor device according to a first embodiment of the present invention. FIG. 2A illustrates a cross sectional view taken along the line I-I' of FIG. 1. FIG. 2B illustrates a cross sectional view taken along the line II-II' of FIG. 1. FIG. 2C illustrates a cross sectional view taken along the line III-III' of FIG. 1.

Referring to FIGS. 1, 2A, 2B, and 2C, a semiconductor device according to example embodiments may include a lower semiconductor layer 100 and an upper semiconductor layer 200 over the lower semiconductor layer 100.

The lower semiconductor layer 100 may be, e.g., a single crystalline silicon wafer. As illustrated in FIG. 2B, a lower device isolation layer 102 may be disposed in the lower semiconductor layer 100 to define a first active region 103. First gate lines 120S, 120W, and 120G may be disposed on the first active region 103, as illustrated in FIGS. 2A and 2C. The first gate lines 120S, 120W, and 120G may be gate lines of, e.g., a NAND flash memory device. The first gate lines 120S, 120W, and 120G may be referred to as a first word line 120W, a first string selection line 120S, and a first ground line 120G, respectively, and may cross the first active region 103 and the first device isolation layer 102. The first word line 120W, the first string selection line 120S, and the first ground line 120G may include a first gate insulating pattern 104, a first floating gate pattern 106, a first gate interlayer insulating pattern 108, and a first control gate pattern 110 that may be sequentially stacked. The first floating gate pattern 106 and the first control gate pattern 110 of the first word line 120W may be electrically insulated, e.g., completely insulated, from each other by the first gate interlayer insulating pattern 108. The first floating gate pattern 106 and the first control gate pattern 110 of the first string selection line 120S and the first floating gate pattern 106 and the first control gate pattern 110 of the ground selection line 120G may be electrically connected to each other through a butting contact.

First conductive regions 123D, 123, and 123S may be disposed in the first active region 103 between the first gate lines 120S, 120W, and 120G. The first conductive regions 123D, 123, and 123S may include, e.g., may refer to respective, first drain regions 123D, first cell impurity regions 123, and first source regions 123S. Each of the first cell impurity regions 123 may be disposed on both sides of the first word line 120W. The first drain regions 123D may be disposed between two adjacent first string selection line 120S, i.e., between the first string selection line 120S and a first string selection line of a different string adjacent to the first string selection line 120S. The first drain regions 123D may be disposed to be spaced apart from each other along a direction parallel to a lengthwise direction of the first string selection line 120S by the lower device isolation layer 102. The first source regions 123S may be disposed between two adjacent ground selection lines 120G, i.e., between the first ground selection line 120G and a first ground selection line of a different string adjacent to the first ground selection line 120G. The first source regions 123S may be disposed to be spaced apart from each other along a direction parallel to a lengthwise direction of the first ground selection line 120G by the lower device isolation layer 102. The first conductive regions 123D, 123, and 123S may be regions doped with N-type impurity or P-type impurity. The first source regions 123S may include a dummy first source region 123SD. The dummy first source region 123SD may be a conductive region but may not be used as a conductive region of a transistor.

A lower common source line 310 may be disposed on a top surface of the first source regions 123S between the first ground selection line 120G and a first ground selection line of a different string adjacent to the first ground selection line 120G. The lower common source line 310 may be spaced apart from each of the first ground selection line 120G and a first ground selection line of a different string. As illustrated in FIG. 2B, the lower common source line 310 may have a line shape overlapping a plurality of active regions 102, and may extend in parallel to the first ground selection line 120G. The lower common source line 310 may be in contact with a top surface of the first source regions 123S to electrically connect with each other. The lower common source line 310 may include, e.g., polysilicon having an impurity of the same conductivity type as the first conductive regions 123D, 123, and 123S.

Alternatively, the lower common source line 310 may be replaced with the first source regions 123S and source connection regions (not shown). The source connection regions may be regions including an impurity implanted therein, i.e., an impurity implanted into the lower semiconductor layer 100, instead of the device isolation layer 102, i.e., the device isolation layer 102 between the first source regions 123S may be removed. The impurity may be the same conductivity type as the first source regions 123S. The source connection regions and the first source regions 123S may be electrically connected to each other and may have a line shape having a concavo-convex structure.

A first interlayer insulating layer 140 may cover the first gate lines 120S, 120W, and 120G. The lower common source line 310 may penetrate the first interlayer insulating layer 140, e.g., top surfaces of the common source line 310 and first interlayer insulating layer 140, i.e., surfaces facing away from the first source regions 123S, may be substantially coplanar. A second interlayer insulating layer 160 may cover the top surfaces of the lower common source line 310 and first interlayer insulating layer 140.

The upper semiconductor layer 200 may be disposed on the second interlayer insulating layer 160. The upper semiconductor layer 200 may include, e.g., a single crystalline silicon wafer. The upper semiconductor layer 200 may include a well into which an impurity of a conductivity type different from the first conductive regions 123D, 123, and 123S may be implanted. The upper semiconductor layer 200 may be disposed to be plural number over the lower semiconductor layer 100. A second device isolation layer 202 may be disposed in the upper semiconductor layer 200 to define a second active region 203, as illustrated in FIGS. 1 and 2B. The second device isolation layer 202 may be, e.g., a silicon oxide layer. Second gate lines 220S, 220W, and 220G may be disposed on the second active region 203. The second gate lines 220S, 220W, and 220G may be gate lines of, e.g., a NAND flash memory device. The second gate lines 220S, 220W, and 220G may include, e.g., refer to respective, a second word line 220W, a second string selection line 220S, and a second ground line 220G crossing the second active region 203 and the second device isolation layer 202, as illustrated in FIG. 1. The second word line 220W, the second string selection line 220S, and the second ground line 220G may include a second gate insulating pattern 204, a second floating gate pattern 206, a second gate interlayer insulating pattern 208, and a second control gate pattern 210 that may be sequentially stacked. The second floating gate pattern 206 and the second control gate pattern 210 of the second word line 220W may be electrically insulated from each other by the second gate interlayer insulating pattern 208. The second floating gate pattern 206 and the second control gate pattern 210 of the second selection line 220S and the second floating gate pattern 206 and the second control gate pattern 210 of the ground selection line 220G may be electrically connected to each other through a butting contact.

Second conductive regions 223D, 223, and 223S may be disposed in the second active region 203 between the second gate lines 220S, 220W, and 220G. The second conductive regions 223D, 223, and 223S may include second drain regions 223D, second cell impurity regions 223, and second source regions 223S. Each of the second cell impurity regions 223 may be disposed on both sides of the second word line 220W. The second drain regions 223D may be disposed between the second string selection line 220S and a second string selection line of a different string adjacent to the second string selection line 120S. The second drain regions 223D may be disposed to be spaced apart from each other along a direction parallel to a lengthwise direction of the second string selection line 220S by the upper device isolation layer 202. The second source regions 223S may be disposed between the second ground selection line 220G and a second ground selection line of a different string adjacent to the second ground selection line 220G. The second source regions 223S may be disposed to be spaced apart from each other along a direction parallel to a lengthwise direction of the second ground selection line 220G by the upper device isolation layer 202. The second conductive regions 123D, 123, and 123S may be regions doped with the same impurity as the first conductive regions 123D, 123, and 123S. The second source regions 223S may include a dummy second source region 223SD. The dummy second source region 223SD may be a conductive region but may not be used as a conductive region of a transistor.

The upper semiconductor layer 200 may include a penetration hole 200H, as illustrated in FIGS. 1-2B. As illustrated in FIG. 2A, the penetration hole 200H may penetrate the upper semiconductor layer 200 through the dummy second source region 223SD, so the penetration hole 200H may extend through the dummy second source region 223SD, i.e., through an entire thickness of the dummy second source region 223SD, and through the upper semiconductor layer 200 under the dummy second source region 223SD, e.g., to contact the second interlayer insulating layer 160. As further illustrated in FIG. 2A, the penetration hole 200H may be disposed between two adjacent second ground selection lines 220G, i.e., between the second ground selection line 220G and a different second ground selection line adjacent to the second ground selection line 220G. The penetration hole 200H may penetrate through a second active region 203 and through a portion of the upper device isolation layer 202 adjacent to both sides of the dummy second source region 223SD and the upper semiconductor layer 200 under the portion of the upper device isolation layer 202. As illustrated in FIG. 2A, a width of the penetration hole 200H along a first horizontal direction, i.e., a direction along a line connecting two adjacent ground selection lines 220G, may be smaller than a distance between two adjacent ground selection lines 220G. As illustrated in FIG. 2B, a width of the penetration hole 200H along a second horizontal direction, i.e., a direction perpendicular to the first horizontal direction and extending along a line connecting two adjacent second active region 203, may be smaller than a distance between two adjacent second source regions 223S adjacent to both sides of the dummy second source region 223SD. A plurality of penetration holes 200H may be formed, so the penetration holes 200H may be spaced apart from each other along a lengthwise direction of the second ground selection line 220G, i.e., along the second horizontal direction.

As illustrated in FIGS. 2A-2C, a third interlayer insulating layer 240 may cover the second gate lines 220S, 220W, and 220G, and may fill, e.g., completely fill and cover, the penetration hole 200H. A fourth interlayer insulating line 260 may be disposed on the third interlayer insulating layer 240. An upper common source line 320 may penetrate the fourth interlayer insulating layer 260, so that the upper common source line 320 may be disposed on the third interlayer insulating layer 240, as illustrated in FIGS. 2A-2C. The upper common source line 320 may be parallel to the second ground selection line 220G and may have a line shape, as illustrated in FIG. 1. The upper common source line 320 may be aligned with the lower common source line 310, e.g., the upper and lower common source lines 310 and 320 may completely overlap each other. The penetration hole 200H may be disposed between the upper common source line 320 and the dummy first conductive region 123SD. As illustrated in FIG. 2B, the upper source line 320 may be spaced apart from each of the second source regions 223S along a vertical direction, i.e., a direction along a line connecting the lower and upper common source lines 310 and 320. The upper common source line 320 may include, e.g., polycrystalline silicon having an impurity of the same conductivity type as the lower common source line 310.

A first conductive plug 315D may be disposed between the upper common source line 320 and the lower common source line 310, and a second conductive plug 315C may be disposed between the upper common source line 320 and the second source regions 223S. The first conductive plug 315D may penetrate the third interlayer insulating layer 240 and may pass through the penetration hole 200H, e.g., the first conductive plug 315D may be in a center of the penetration hole 200H. The first conductive plug 315D may penetrate the second interlayer insulating layer 160 to contact, e.g, directly contact, a portion of the top surface of the lower common source line 310. The upper common source line 320 and the lower common source line 310 may be electrically connected to each other through the first conductive plug 315D, e.g., each of the upper common source line 320 and the lower common source line 310 may be wider than the first conductive plug 315D along the first horizontal direction. According to a first embodiment of the present invention, the first conductive plug 315D may be spaced apart from a sidewall of the penetration hole 200H along the first horizontal direction, e.g., a portion of the third interlayer insulating layer 240 may be between the first conductive plug 315D and the sidewall of the penetration hole 200H, to be electrically independent of the upper semiconductor layer 200. Thus, a limitation of a material used in the first conductive plug 315D may be minimized. The first conductive plug 315D may include, e.g., one or more of tungsten, titanium, tantalum, a titanium nitride layer, a tantalum nitride layer, and tungsten nitride layer. In another example, the first conductive plug 315D may include polycrystalline silicon having an impurity of the same conductivity type as the upper and lower conductive lines 320 and 310.

The second conductive plug 315C may penetrate the third interlayer insulating layer 240 to contact, e.g., directly contact, a top surface of the second source region 223S. The second conductive plugs 315C may be spaced apart from each other along the second horizontal direction, e.g., a portion of the third interlayer insulating layer 240 may be between two adjacent second conductive plugs 315C. The upper common source line 320 and the second source region 223S may be electrically connected to each other through the second conductive plug 315C. The second conductive plug 315C may include, e.g., one or more of tungsten, titanium, tantalum, a titanium nitride layer, a tantalum nitride layer, and tungsten nitride layer. In another example, the second conductive plug 315C may include, e.g., polycrystalline silicon having an impurity of the same conductivity type as the upper and lower conductive lines 320 and 310.

The common source line 320, the lower common source line 310, the first conductive plug 315D, and the second conductive plug 315C may define a common source line structure.

According to an example embodiment, since the dummy second source region 223SD is not used as a conductive region of a transistor, the upper common source line 320 may not be electrically connected to the dummy second source region 223SD remaining on a sidewall of the penetration hole 200H, e.g., the upper common source line 320 may be insulated from the dummy second source region 223SD via the third interlayer insulating layer 240. It is noted, therefore, that an additional plug for electrically connecting the dummy second source region 223SD may not be required. Further, a width of the upper common source line 320 along the first horizontal direction may not extend into the remaining dummy second source region 223SD, e.g., the upper common source line 320 may not overlap the remaining dummy second source region 223SD, so as to reduce a contact resistance to the remaining dummy second source region 223SD. Consequently, an increased chip size due to an extension of a width of the upper common source line 320 or an additional use of a plug may be prevented by disposing a penetration hole 200H penetrating the upper semiconductor layer 200 of the dummy second source region 223SD. Thus, damage during integration of a semiconductor device due to a multilayer structure may be minimized.

A fifth interlayer insulating layer 440 may cover the fourth interlayer insulating layer 260. Bit lines 500 may be disposed on the fifth interlayer insulating layer 440 to cross the second gate lines 220S, 220W, and 220G. The bit line 500 may be electrically connected to the first and second drain regions 123D and 223D through a bit line contact 252. The bit lines 500 may include a dummy bit line 500D. The dummy bit line 500D may include first dummy bit line slices 500DA and second dummy bit line slices 500DB. The first dummy bit line slices 500DA may be on the dummy second source region 223SD, and the second dummy bit line slices 500DB may not be electrically connected to the first dummy bit line slices 500DA. A strapping line (not shown) may be formed on the first dummy bit line slices 500DA. To reduce a resistor size of the common source line, the strapping line may be disposed on the common source line and may be a metal line electrically connected to the common source line. The strapping line and the common source line structure may be electrically connected to each other through the first dummy bit line slice 500DA. A number of the strapping lines may be determined by the number of the bit lines (or rows). The penetration hole 200H may be determined by the number of the bit lines (or rows).

Figure 11:
FIG. 11 illustrates a circuit of a resistor of a single common source line.
Figure 12:
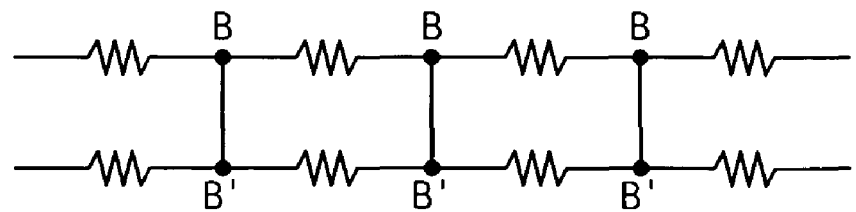
FIG. 12 illustrates a circuit of a resistor of a common source line structure according to an embodiment of the present invention.
Figure 13:
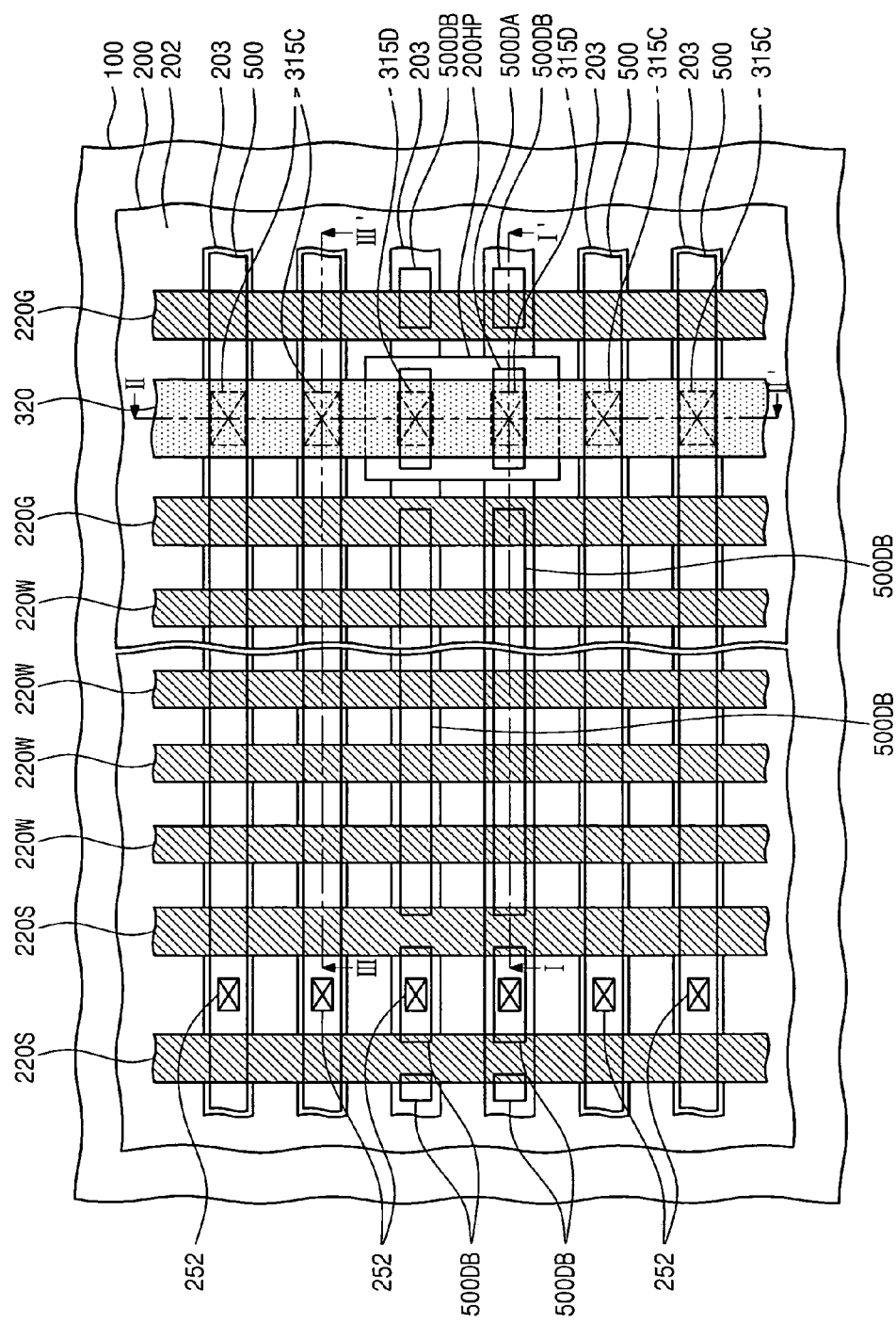
FIG. 13 illustrates a top plan view of a semiconductor device according to another embodiment of the present invention.
Figure 14A:
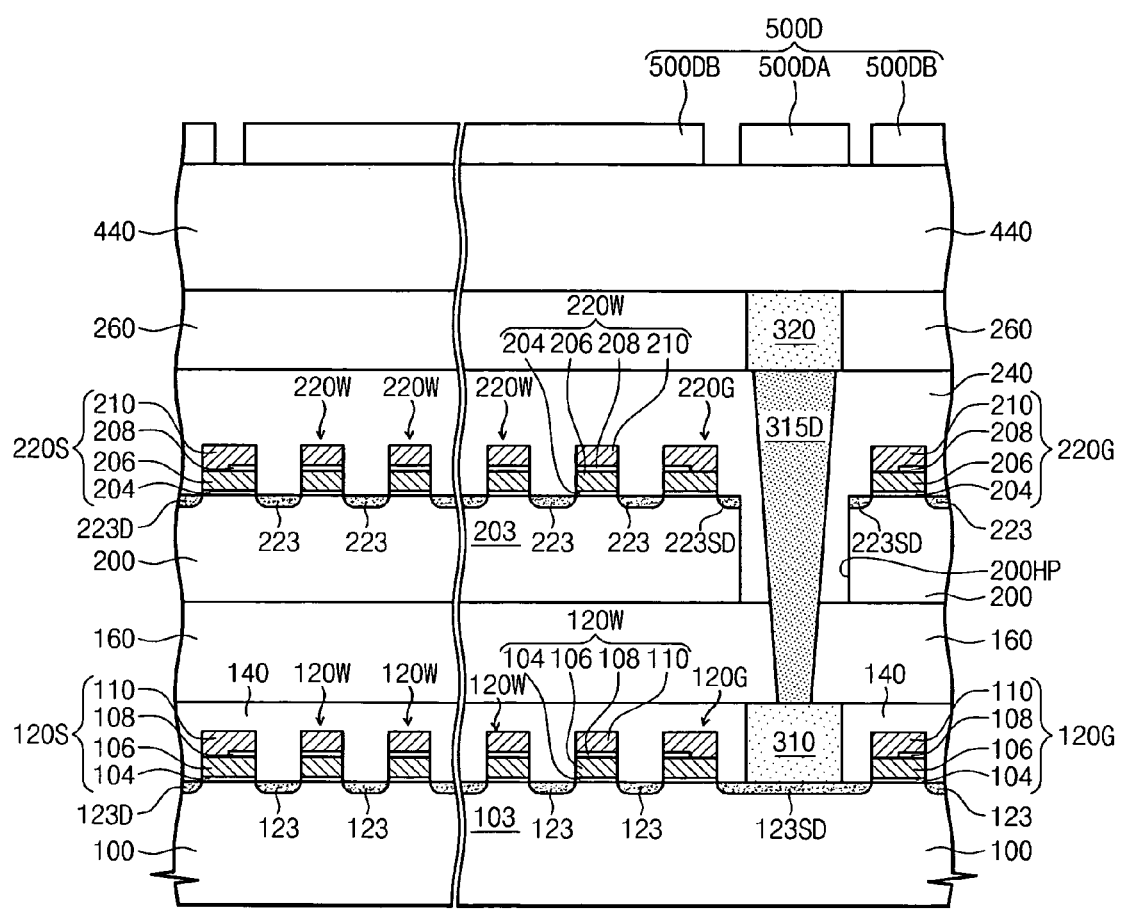
FIG. 14A illustrates a cross sectional view along line I-I' of FIG. 13.
Figure 14B:
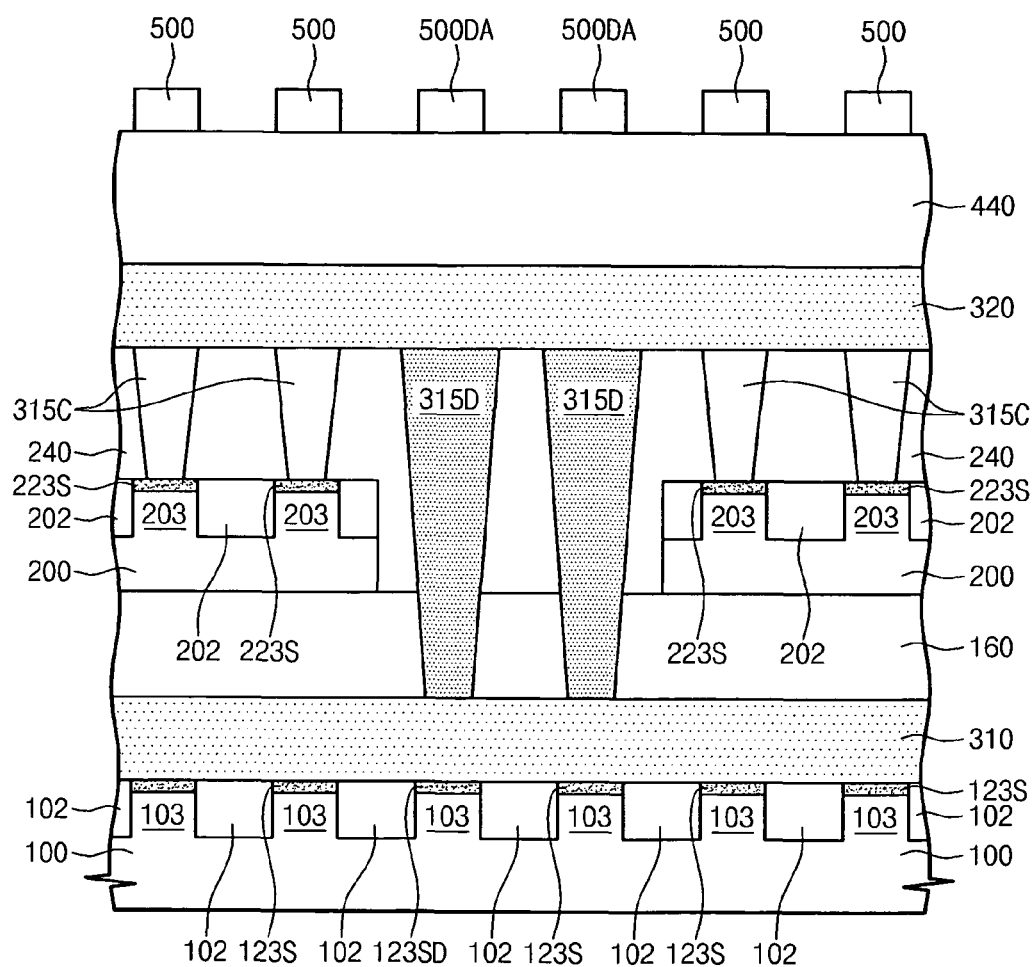
FIG. 14B illustrates a cross sectional view along line II-II' of FIG. 13.
Figure 14C:
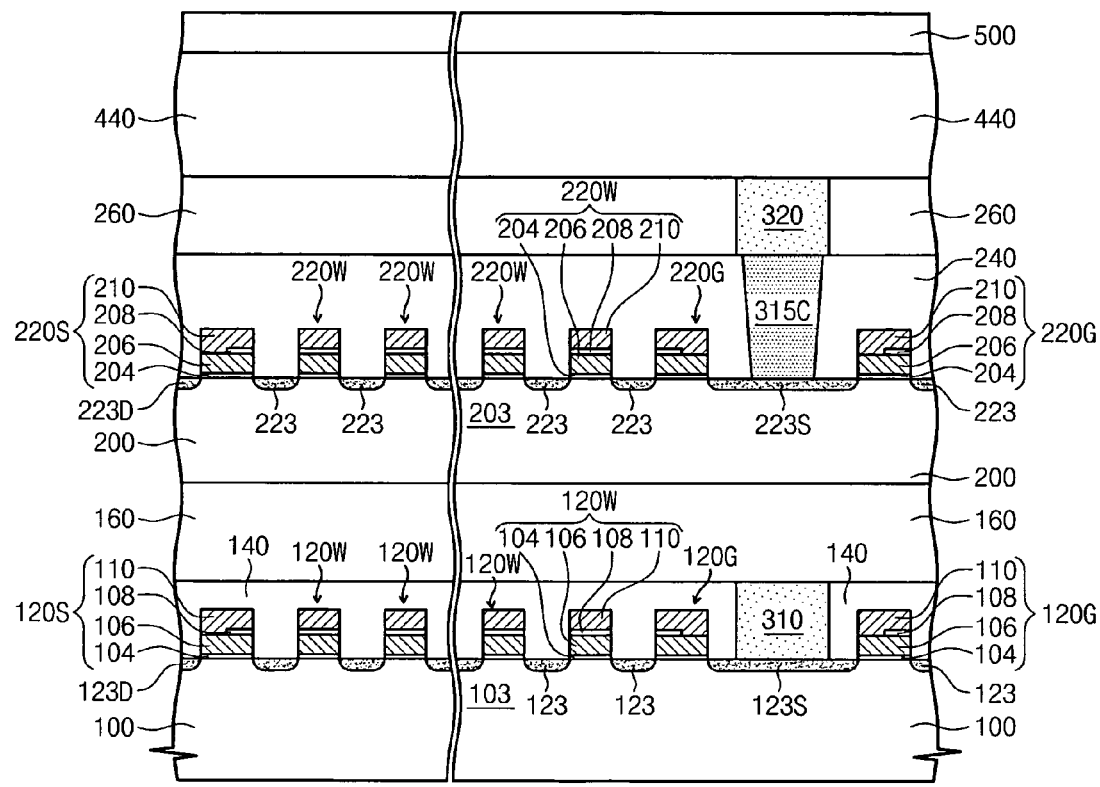
FIG. 14C illustrates a cross sectional view along line III-III' of FIG. 13.
Figure 15:
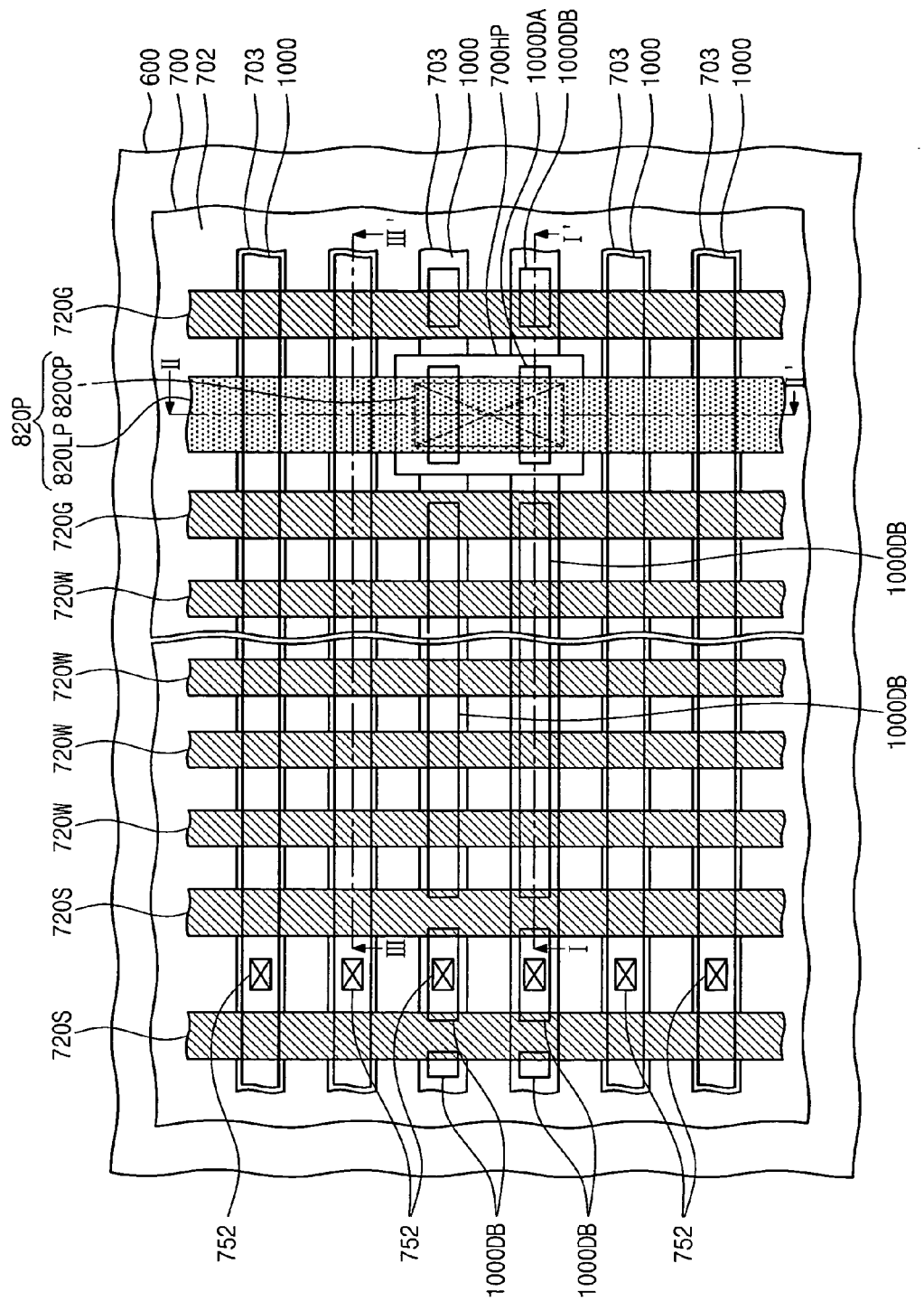
FIG. 15 illustrates a top plan view of a semiconductor device according to another embodiment of the present invention.
Figure 16A:
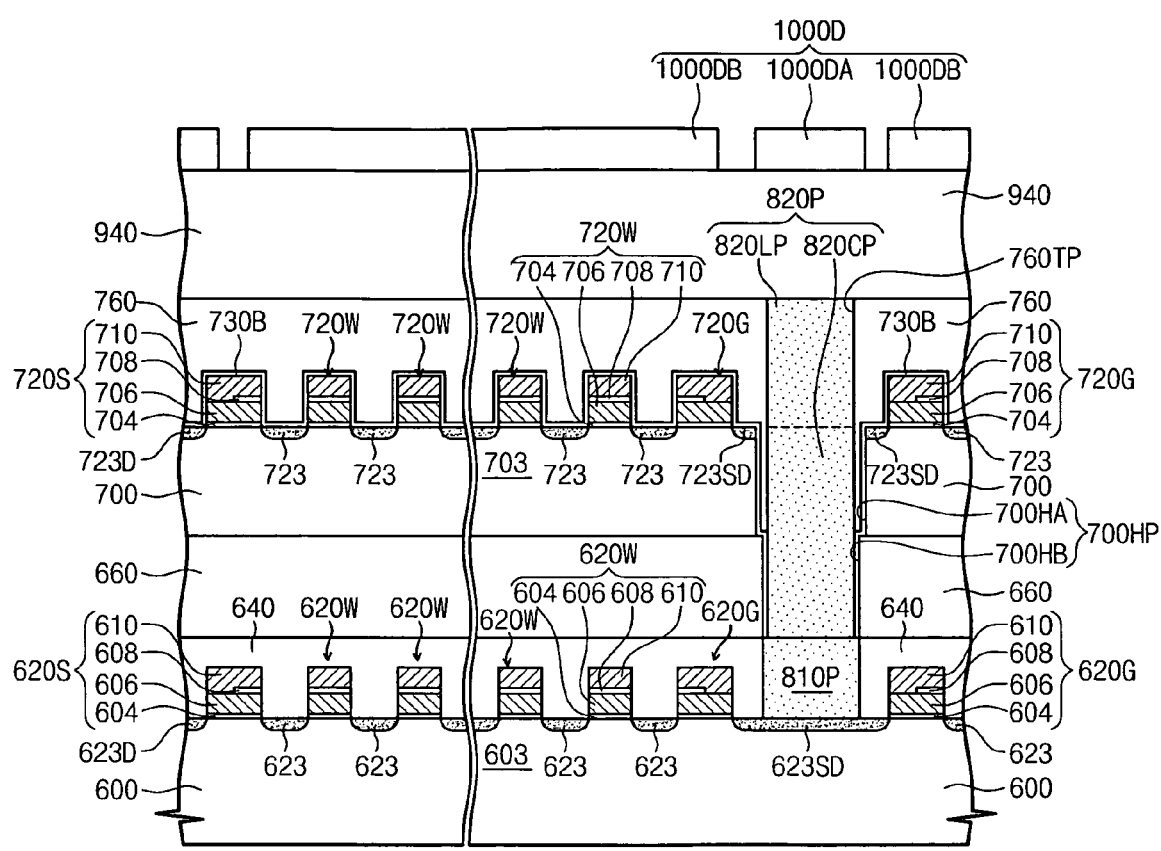
FIG. 16A illustrates a cross sectional view along line I-I' of FIG. 15.
Figure 16B:
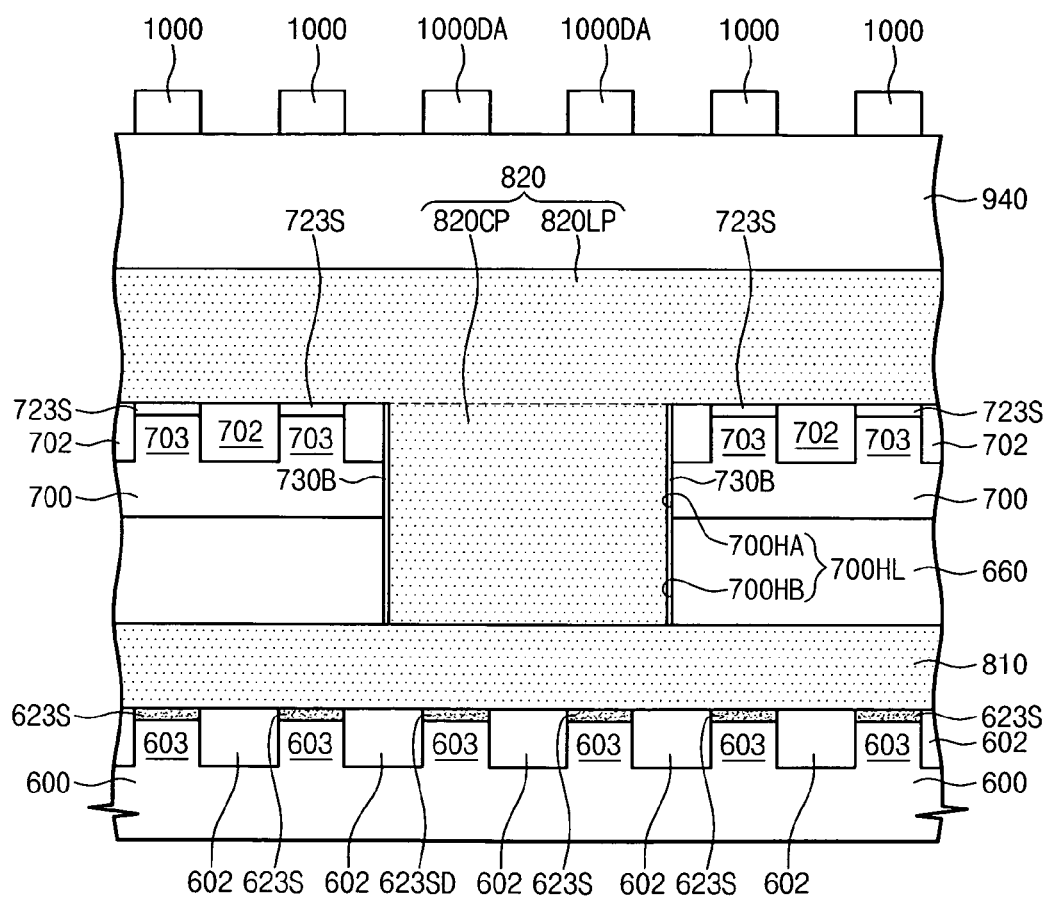
FIG. 16B illustrates a cross sectional view along line II-II' of FIG. 15.
Figure 16C:
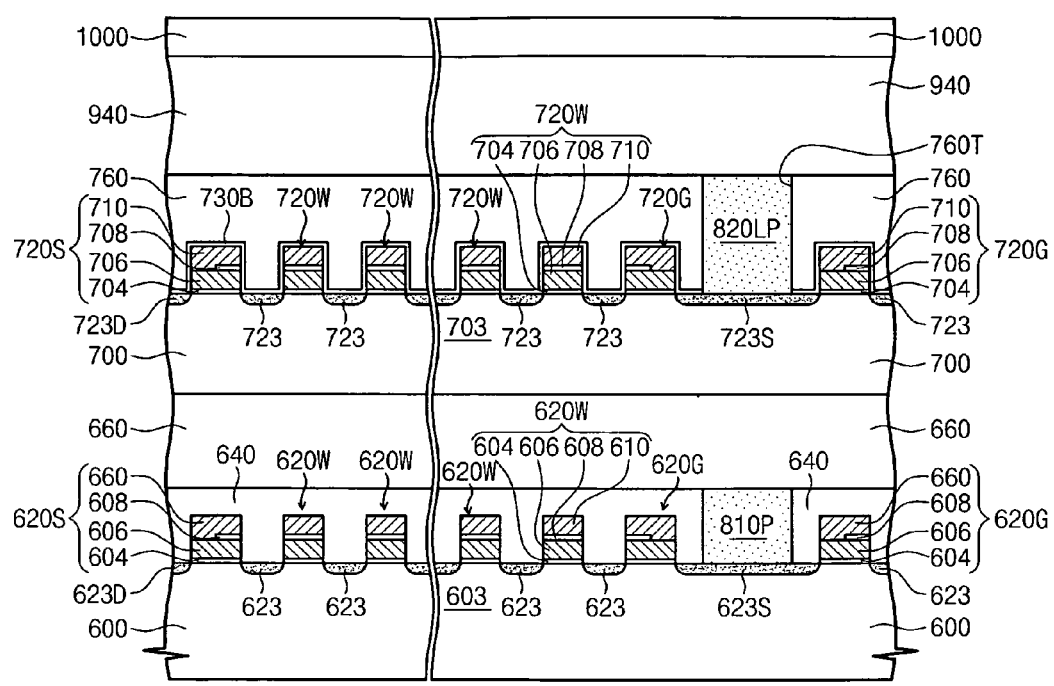
FIG. 16C illustrates a cross sectional view along line III-III' of FIG. 15.

FIG. 11 illustrates a circuit of resistors of a single common source line. FIG. 12 illustrates a circuit of resistors of a common source line structure according to a first embodiment of the present invention. The single common source line refers to a common source line that penetrates the upper semiconductor layer of a central portion of the second source regions along a direction perpendicular to a lengthwise direction of the bit line. The single common source line may be in contact with a top surface of the first source regions, and may be electrically connected to the second source regions remaining on an extended sidewall.

Referring to FIGS. 11 and 12, each of points (A) in FIG. 11 refers to a location to which the strapping line may be electrically connected. Points (B) and (B') in FIG. 12 may be electrically connected to each other by the first conductive plug 315D, and refer to locations to which the strapping line may be electrically connected. Each of the resistors of FIGS. 11 and 12 has the same resistance and the first conductive plug 315D has a very low resistance. Resistors of the single common source line in FIG. 11 are connected in series, while resistors of the common source line structure in FIG. 12 are connected in parallel. Accordingly, the common source line structure in FIG. 12, i.e., a structure according to the first exemplary embodiment, may have a lower resistance compared with the resistance of the single common source line in FIG. 11.

Referring to FIGS. 3A through 3E, 4A through 4E, and 5A through 5E, a method of manufacturing a semiconductor device according to an example embodiment will be described hereinafter. FIGS. 3A through 3F illustrate cross sectional views along line I-I' of FIG. 1. FIGS. 4A through 4F illustrate cross sectional views along line II-II' of FIG. 1. FIGS. 5A through 5F illustrate cross sectional views along line III-III' of FIG. 1.

Referring to FIGS. 1, 3A, 4A, and 5A, the lower semiconductor layer 100 may be provided. The lower semiconductor layer 100 may include, e.g., a single crystalline silicon wafer.

The lower device isolation layer 102 may be formed in the lower semiconductor layer 100 to define the active region 103. The lower device isolation layer 102 may be formed by performing, e.g., a shallow trench isolation (STI) process.

The first gate lines 120S, 120W, and 120G may be formed on the first active region 103. The first gate lines 120S, 120W, and 120G may be gate lines of, e.g., a NAND flash memory device. The first gate lines 120S, 120W, and 120G may include the first word line 120W, first string selection line 120S, and first ground selection line 120G crossing the first active region 103 and the lower device isolation layer 102.

The first conductive regions 123D, 123, and 123S may be formed on the first active region 103 between the first gate lines 120S, 120W, and 120G using the first gate lines 120S, 120W, and 120G as an ion implanting mask. The first conductive regions 123D, 123, and 123S may include the first drain regions 123D, first impurity regions 123, and first source regions 123S. Each of the first source regions 123S may be formed to be spaced apart from each other by the lower device isolation layer 102 along a direction parallel to a lengthwise direction of the first ground selection line 120G. The first conductive regions 123D, 123, and 123S may be doped with a P-type impurity or an N-type impurity. The first source regions 123S may include a dummy first source region 123SD. The dummy first source region 123SD may be a conductive region but may not be used as a conductive region of a transistor.

Referring to FIGS. 1, 3B, 4B, and 5B, the first interlayer insulating layer 140 including a lower trench 140T may be formed to cover the first gate lines 120S, 120W and 120G. The lower trench 140T may be formed through the first interlayer insulating layer 140 to expose the top surface of the first source regions 123S and the top surface of the first device isolation layer 102. The lower trench 140T may extend in a line to be parallel to the first ground selection line 120G. The lower trench 140T may be filled, e.g., completely filled, with a conductive material to form the lower common source line 310 in contact with the top surface of the first source region 123S. The lower common source line 310 may be electrically connected to each of the first source regions 123S. The lower common source line 310 may include, e.g., polycrystalline silicon having an impurity of the same conductivity type as the first conductive regions 123D, 123, and 123S.

After an exposed lower device isolation layer 102 between the first source regions 123S is removed to expose the lower semiconductor layer 100, an impurity may be implanted into the exposed lower semiconductor layer 100 to form source connection regions (not shown). The above impurity may have the same conductivity type as the first source regions 123S. The source connection regions and the first source regions 123S may be electrically connected to each other and may have a line shape having a concave-convex structure. The lower common source line 310 may be replaced with the first source regions 123S and the source connection regions.

Referring to FIGS. 1, 3C, 4C, and 5C, the second interlayer insulating layer 160 may be formed on the first interlayer insulating layer 140 to cover the lower common source line 310.

The upper semiconductor layer 200 may be formed on the second interlayer insulating layer 160. For example, the upper semiconductor layer 200 may be formed by attaching a semiconductor substrate, e.g., of a substantially same type as the lower semiconductor layer 100, to a top surface of the second interlayer insulating layer 160. In another example, the upper semiconductor layer 200 may be formed using an epitaxy growth process. The upper semiconductor layer 200 may include, e.g., a single crystalline silicon wafer. The upper semiconductor layer 200 may include the first conductive regions 123D, 123, and 123S and a well into which a conductive impurity different from the first conductive regions 123D, 123, and 123S may be implanted. The upper semiconductor layer 200 may be formed to be plural number on the lower semiconductor layer 100.

The second device isolation layer 202 may be formed in the upper semiconductor layer 200 to define the second active region 203. The second gate lines 220S, 220W, and 220G may be formed on the second active region 203. The second gate lines 220S, 220W, and 220G may cross the second active region 203 and the second device isolation layer 202. The second gate lines 220S, 220W, and 220G may be gate lines of a NAND flash memory device. The second gate lines 220S, 220W, and 220G may include a second word line 220W, a second string selection line 220S, and a second ground selection line 220G.

Second conductive regions 223D, 223, and 223S may be formed in the second active region 203 between the second gate lines 220S, 220W, and 220G. The second conductive regions 223D, 223, and 223S may be doped with an impurity of the same conductivity type as the first conductive regions 123D, 123, and 123S. The second conductive regions 223D, 223, and 223S may include second drain regions 223D, second cell impurity regions 223, and second source regions 223S. The second source regions 223S may be disposed between the second ground selection line 220G and a second ground selection line of a different string. Each of the second source regions 223S may be disposed to be spaced apart from each other by the upper device isolation layer 202. The second source regions 223S may include a dummy second source region 223SD. The dummy second source region 223SD may be a conductive region but may not be used as a conductive region of a transistor.

A mask layer 230 may be formed to cover the second gate lines 220S, 220W, and 220G and to expose the dummy second source region 223SD. For example, the mask layer 230 may be a photoresist layer. The exposed dummy second source region 223SD and the upper semiconductor layer 200 may be etched using the mask layer 230 as a mask to form the penetration hole 200H revealing a portion of the second interlayer insulating layer 160. The etching process may be an anisotropic process. For example, the etching process may be a plasma etching process using a mixing gas including hydrogen bromide gas (HBr), chlorine gas ($Cl_2$), and fluorine gas ($F_2$).

The penetration hole 200H may be formed between the second ground selection line 220G and a different second ground selection line adjacent to the second ground selection line 220G. The penetration hole 200H may further penetrate a portion of the upper device isolation layer 203 adjacent to both sides of the dummy second source region 223SD and the upper semiconductor layer 200 under the portion of the upper device isolation layer 203. The penetration hole 200H may have a width smaller than a distance between the second ground selection line 220G and the different second ground selection line. The penetration hole 200H may have a width smaller than a distance between two adjacent source regions 223S, i.e., most adjacent to both sides of the dummy second source region 223SD. A plurality of penetration holes 200H may be formed to be spaced apart from each other along a lengthwise direction of the second ground selection line 220G.

Referring to FIGS. 1, 3D, 4D, and 5D, a third interlayer insulating layer 240 covering the second gate lines 220S, 220W, and 220G, and the penetration hole 200H may be formed. The first conductive plug 315D and the second conductive plug 315C may be simultaneously formed in the third interlayer insulating layer 240. The first conductive plug 315D may penetrate the third interlayer insulating layer and the penetration hole 200H to contact the lower common source line 310. The second conductive plug 315C may penetrate the third interlayer insulating layer 240 to contact the top surface of the second source region 223S. The first and second conductive plugs 315D and 315C may have inclined sidewalls, so that upper widths of the first and second conductive plugs 315D and 315C may be larger than lower widths of respective first and second conductive plugs 315D and 315C.

According to example embodiments, the first conductive plug 315D may be spaced apart from the sidewall of the penetration hole 200H to be electrically independent of the upper semiconductor layer 200. Thus, a limitation of a material used in the first conductive plug 315D may be minimized. The first conductive plug 315D may include at least one of tungsten, titanium, tantalum, a titanium nitride layer, a tantalum nitride layer, tungsten nitride layer, and combinations thereof. The first conductive plug 315D may include, e.g., polycrystalline silicon having an impurity of the same conductivity type as the upper and lower common source lines 320 and 310.

Referring to FIGS. 1, 3E, 4E, and 5E, the fourth interlayer insulating layer 260 including an upper trench 260T which exposes the first conductive plug 315D and each of the second conductive plugs 315C may be formed on the third interlayer insulating layer 240. The upper trench 260T may extend in a line to be parallel to an extension direction of the second ground selection line 220G.

The upper trench 260T may be filled with a conductive material to form the upper common source line 320 which contacts the top surface of the first conductive plug 315D and the top surface of each of the second conductive plugs 315C. The upper common source line 320 may be aligned with the lower common source line 320. The upper common source line 320 may include polycrystalline silicon having an impurity of the same conductivity type as the lower common source line 310. The upper and lower common source lines 320 and 310 may be electrically connected to each other by the first conductive plug 315D.

According to an example embodiment, since the dummy second source region 223SD is not used as a conductive region of a transistor, the upper common source line 320 may not have to be electrically connected to the dummy second source region 223SD remaining on a sidewall of the penetration hole 200H. Further, a width of the upper common source line 320 may not extend to overlap the dummy second source region 223SD remaining on a sidewall of the penetration hole 200H. Consequently, since an expansion of a chip size due to an expansion of the upper common source line 320 may be prevented, an integration of a semiconductor device may be increased.

The upper common source line 320 and each of the second source regions 223S may be electrically connected to the second conductive plug 315C. The upper common source line 320, the lower common source line 310, the first conductive plug 315D, and the second conductive plug 315C may define the common source line structure, e.g., of a NAND flash semiconductor device.

Referring to FIGS. 1, 3F, 4F, and 5F, the fifth interlayer insulating layer 440 may be formed on the fourth interlayer insulating layer 260. Bit lines 500 may be formed on the fifth interlayer insulating layer 440. The bit lines 500 may cross the second gate lines 220S, 220W, and 220G. The bit lines 500 may be electrically connected to the first and second drain regions 123D and 223D through a bit line contact 252. The bit lines 500 may include dummy bit lines 500D. The dummy bit line 500D may include first and second dummy bit line slices 500DA and 500DB. The first dummy bit line slices 500DA may be on the dummy first and second source regions 123D and 223D, and the second dummy bit line slices 500DB may not be electrically connected to the first dummy bit line slices 500DA. A strapping line (not shown) may be formed on the first dummy bit line slices 500DA. The strapping line and the common source line structure may be electrically connected to each other through the first slice.

Referring to FIGS. 6, 7A, 7B, and 7C, a semiconductor device according to another example embodiment will be described. The semiconductor device in FIGS. 6, 7A, 7B, and 7C is substantially the same as the semiconductor device described previously with reference to FIGS. 1, 2A, 2B, and 2C, with the exception of the common source line structure. Description of common features discussed previously will not be repeated for brevity.

Referring to FIGS. 6, 7A, 7B, and 7C, a lower semiconductor layer 600 may include a lower device isolation layer 602 defining a first active region 603, first gate lines 620S, 620W, and 620G, and first conductive regions 623D, 623, and 623S, and a first interlayer insulating layer 640. The gate lines may include a first gate insulating pattern 604, a first floating gate pattern 606, a first gate interlayer insulating pattern 608, and a first control gate pattern 610 that may be sequentially stacked. The first source regions 623S may include a dummy first source region 623SD. The structures between the lower semiconductor layer 600 and a second interlayer insulating layer 660 are substantially the same as respective structures described previously with references to FIGS. 1, 2A, 2B, and 2C, and therefore, detailed description of the structures will be omitted.

An upper semiconductor layer 700 may be disposed on the second interlayer insulating layer 660. A second device isolation layer 702 may be disposed in the upper semiconductor layer 700 to define a second active region 703. The second device isolation layer 702 may be, e.g., a silicon oxide layer. Second gate lines 720S, 720W, and 720G may be disposed on second active region 703. The second gate lines 720S, 720W and 720G may include a second word line 720W, a second string selection line 720S, and a second ground selection line 720G. Second conductive regions 723D, 723, and 723S may be disposed on the second active region 703 between the second gate lines 720S, 720W, and 720G. The second conductive regions 723D, 723, and 723S may include second drain regions 723D, second impurity regions 723, and second source regions 723S. The second source region 723S may include a dummy second source region 723SD. The dummy second source region 723SD may be a conductive region but may not be used as a conductive region of a transistor.

The upper semiconductor layer 700 may include a first penetration hole 700HA. The first penetration hole 700HA may penetrate the upper semiconductor layer 700 in a region corresponding to the dummy second source region 723SD. In other words, the first penetration hole 700HA may penetrate through the dummy second source region 723SD and a region of the upper semiconductor layer 700 under the second dummy source region 723SD. The first penetration hole 700HA may be disposed between the second ground selection line 720G and a different second ground selection line adjacent to the second ground selection line 720G, i.e., between two second ground selection line 720G adjacent to each other along the first horizontal direction. The first penetration hole 700HA may further penetrate a portion of the upper device isolation layer 702 adjacent to both sides of the dummy second source region 723SD and the upper semiconductor layer 700 under the portion of the upper device isolation layer 702. The first penetration hole 700HA may have a width smaller than a distance between the second ground selection line 720G and a different ground selection line adjacent to the second ground selection line 720G. The first penetration hole 700HA may have a width smaller than a distance between the two second source regions 723S adjacent to both sides of the dummy second source region 723SD, i.e., along the second horizontal direction.

Figure 7A:
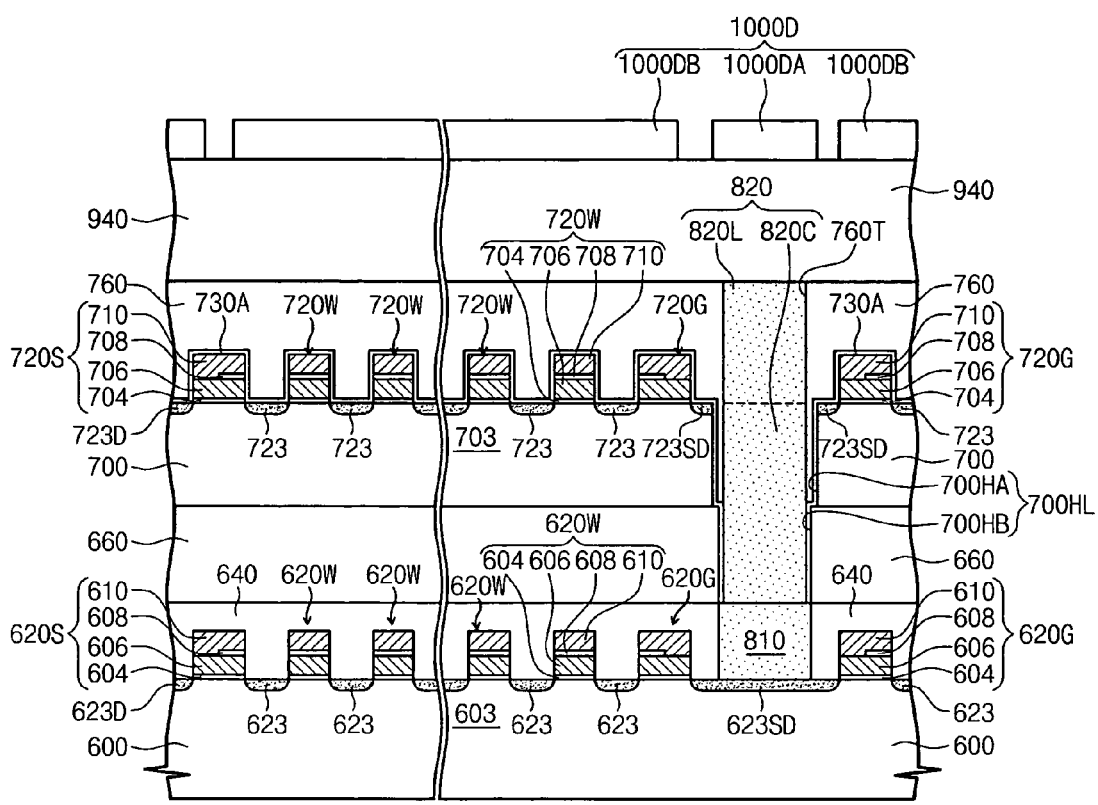
FIG. 7A illustrates a cross sectional view along line I-I' of FIG. 6.
Figure 7B:
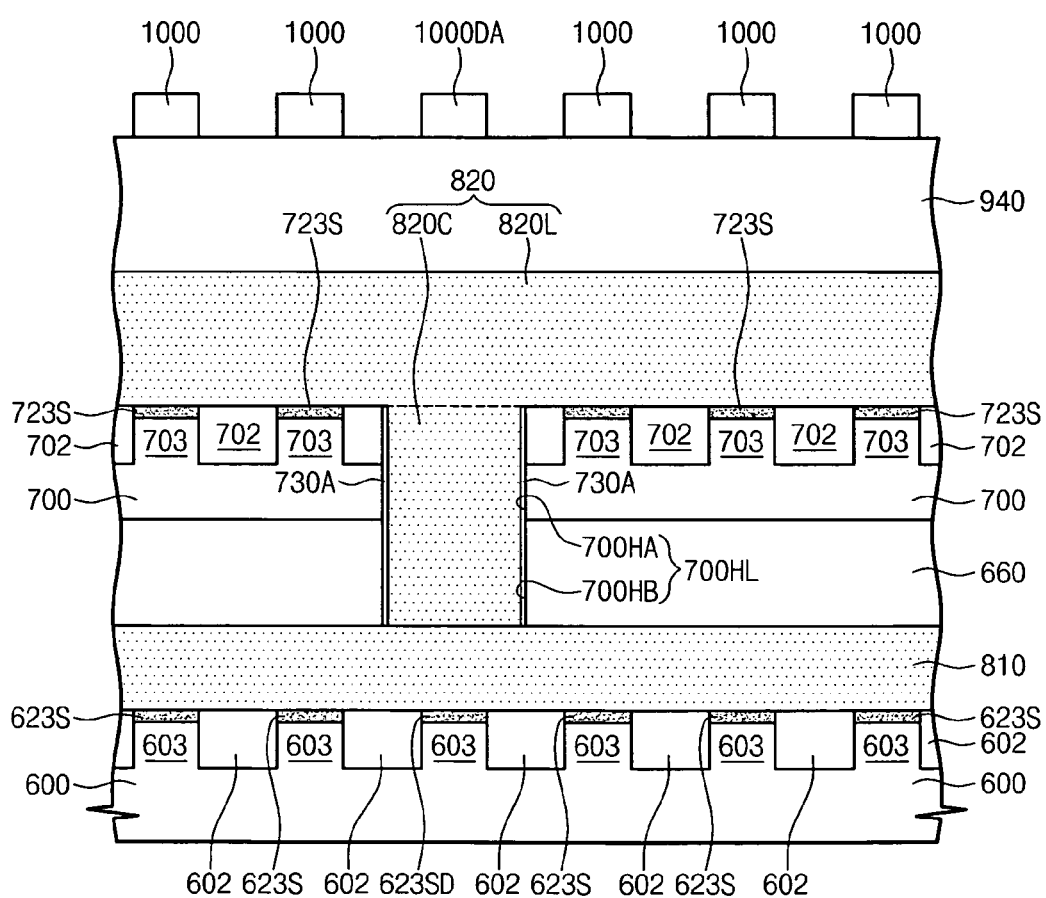
FIG. 7B illustrates a cross sectional view along line II-II' of FIG. 6.

A second penetration hole 700HB may penetrate the second interlayer insulating layer 660. In particular, the second penetration hole 700HB may extend from the first penetration hole 700HA toward the lower semiconductor layer 600 to expose a portion of a top surface of a lower common source line 810. For example, as illustrated in FIG. 7A, the second penetration hole 700HB may have a width smaller than a width of the first penetration hole 700HA along the first horizontal direction. As illustrated in FIG. 7B, the second penetration hole 700HB may have a substantially same width as the width of the first penetration hole 700HA along the second horizontal direction. The first and second penetration holes 700HA and 700HB may define an extended penetration hole 700HL. A plurality of extended penetration holes 700HL may be disposed to be spaced apart from each other along a direction parallel to a lengthwise direction of the second ground selection line 720G, i.e., along the second horizontal direction.

An etch stop pattern 730A may conformally cover the second gate lines 720S, 720W, and 720G, the second conductive regions 723D, 723, and 723S, and a sidewall of the extended penetration hole 700HL. The etch stop pattern 730A may be, e.g., a silicon nitride layer. The etch stop pattern 730A may expose portions of top surfaces of the second source regions 723S and of the upper device isolation layer 702 between the second source regions 723S. The etch stop pattern 730A may expose a portion of a top surface of the lower common source line 810 corresponding to a cross sectional area of the extended penetration hole 700HL. The cross sectional area of the extended penetration hole 700HL may be an area taken along a widthwise direction of the extended penetration hole 700HL.

A third interlayer insulating layer 760 may cover the second gate lines 720S, 720W, and 720G including the etching stop pattern 730A, may expose top surfaces of the second source regions 723S and a top surface of the upper device isolation layer 702 between the second source regions 723S along a direction parallel to a lengthwise direction of the second ground selection line 720G, and may have a complex trench 760T exposing a portion of the top surface of the lower common source line 810 along the extended penetration hole 700HL.

The complex trench 760T may be filled with an upper common source line structure 820. The upper common source line structure 820 may include a conductive plug portion 820C in contact with a portion of the top surface of the lower common source line 810, and an upper source line portion 820L on the conductive plug portion 820C, e.g., in contact with top surfaces of the second source regions 723S. The upper common source line structure 820 may be electrically independent of the upper semiconductor layer 700 by the etch stop pattern 730A disposed between the upper common source line structure 820 and a sidewall of the first penetration hole 700HA and/or the third interlayer insulating layer 760. The upper common source line structure 820 may include polycrystalline silicon having an impurity of the same conductivity type as the lower conductive line 810. The upper common source line structure 820 may include at least one of tungsten, titanium, tantalum, a titanium nitride layer, a tantalum nitride layer, tungsten nitride layer, and combinations thereof.

Figure 7C:
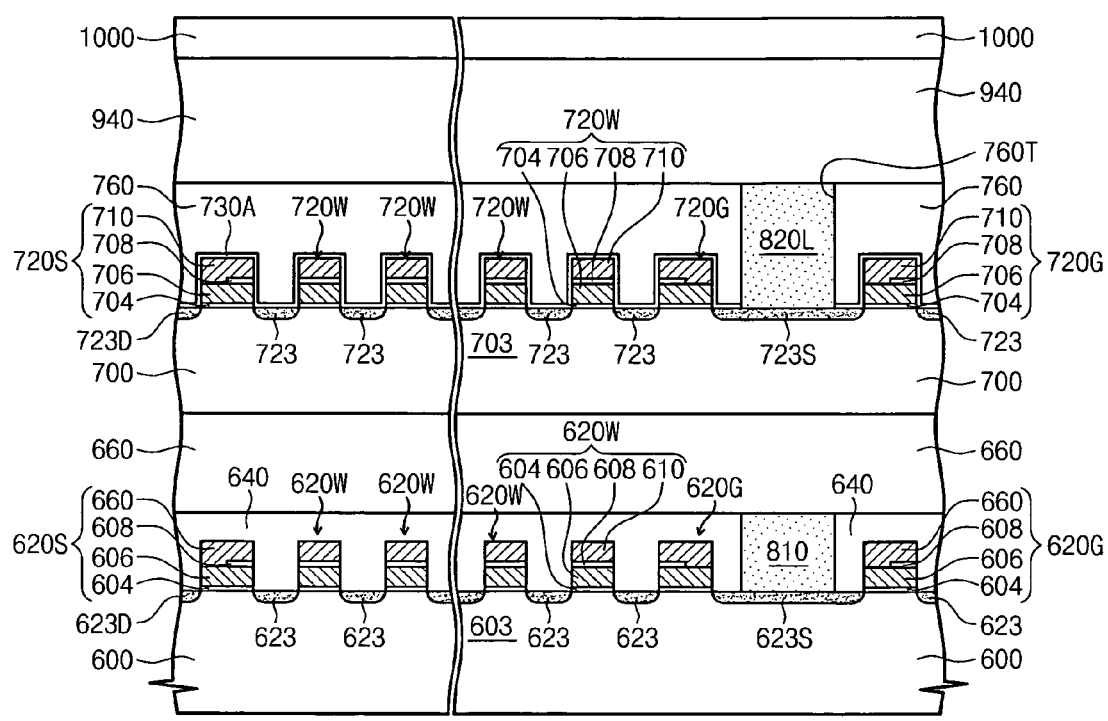
FIG. 7C illustrates a cross sectional view along line III-III' of FIG. 6.
Figure 8A:
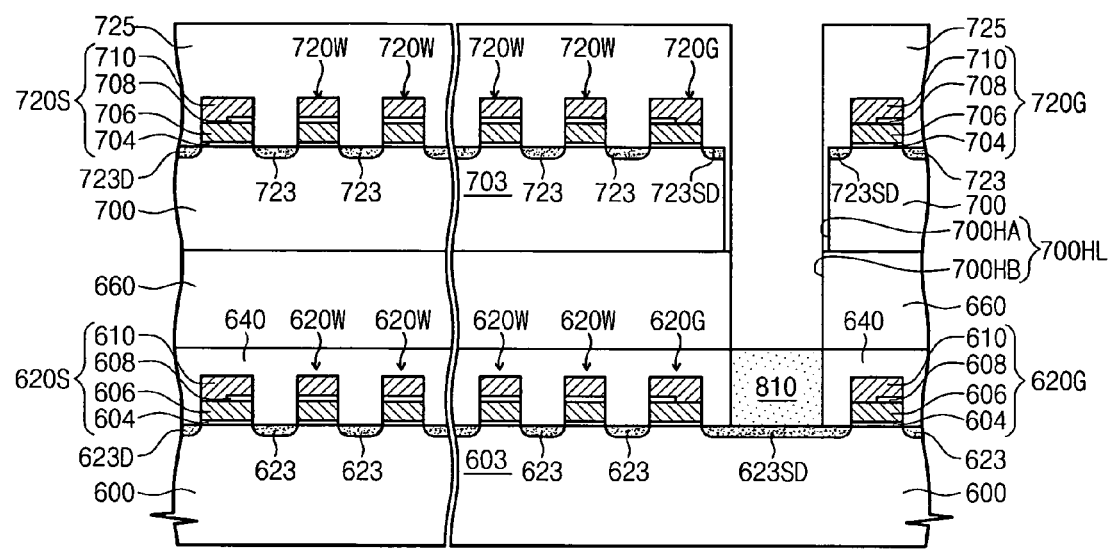
FIG. 8A through 8E illustrate cross sectional views along line I-I' of FIG. 6 to illustrate stages in a method of manufacturing a semiconductor device according to another embodiment of the present invention.
Figure 8B:
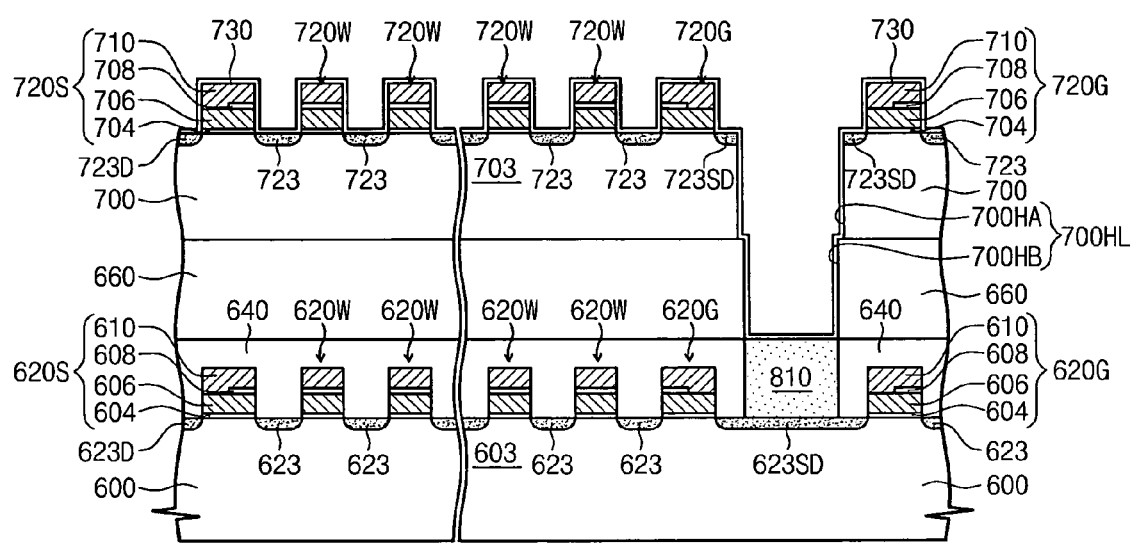
Figure 8C:
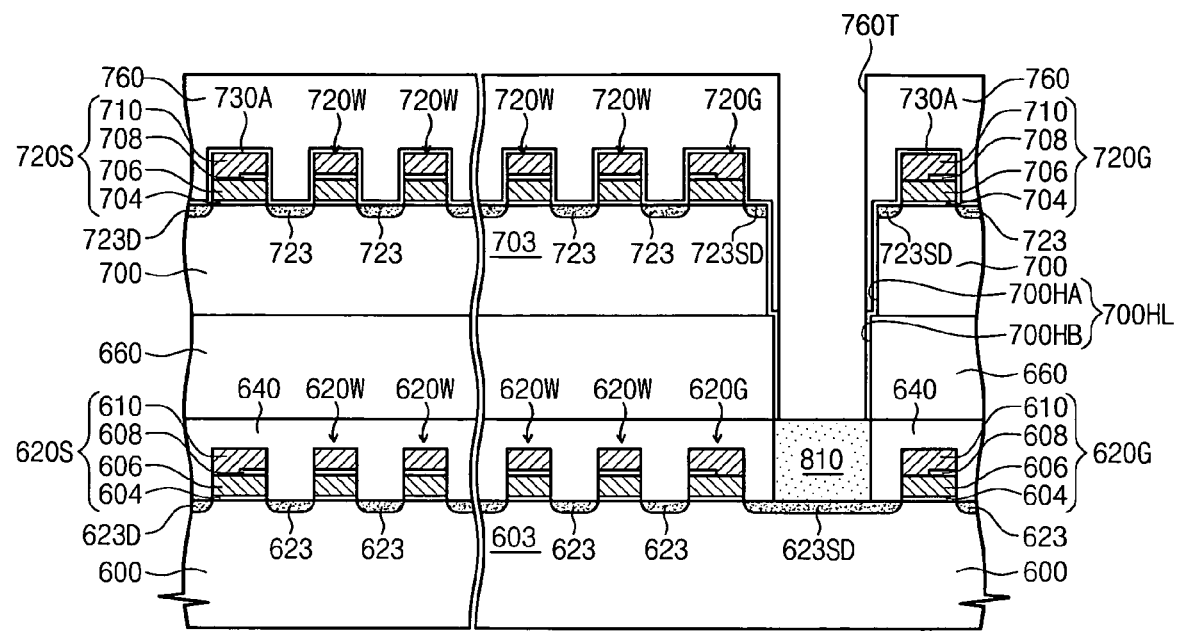
Figure 8D:
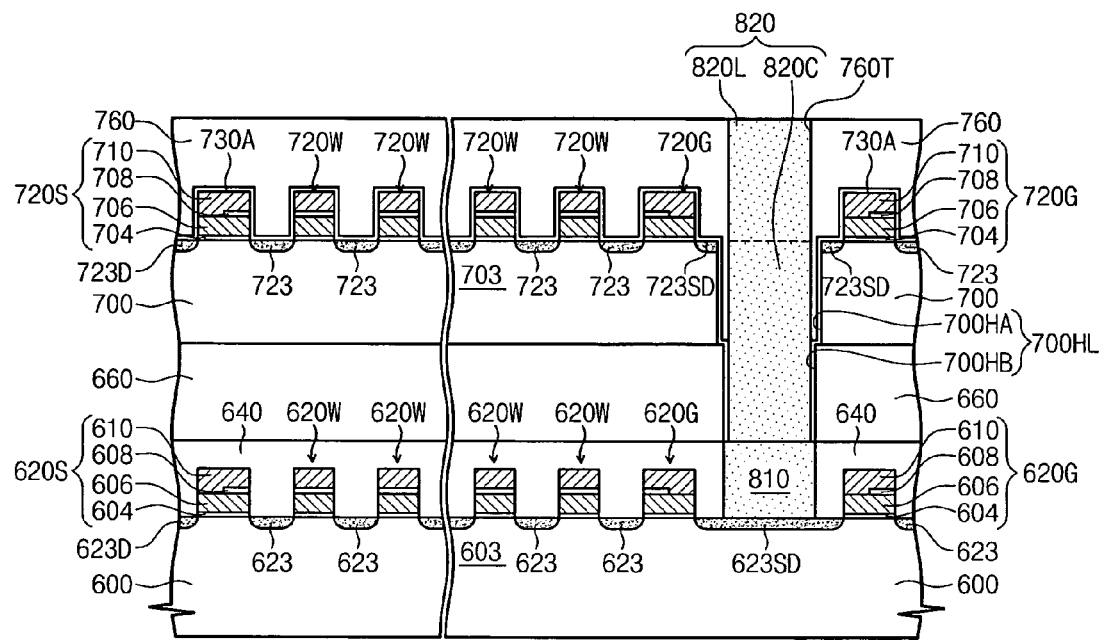
Figure 8E:
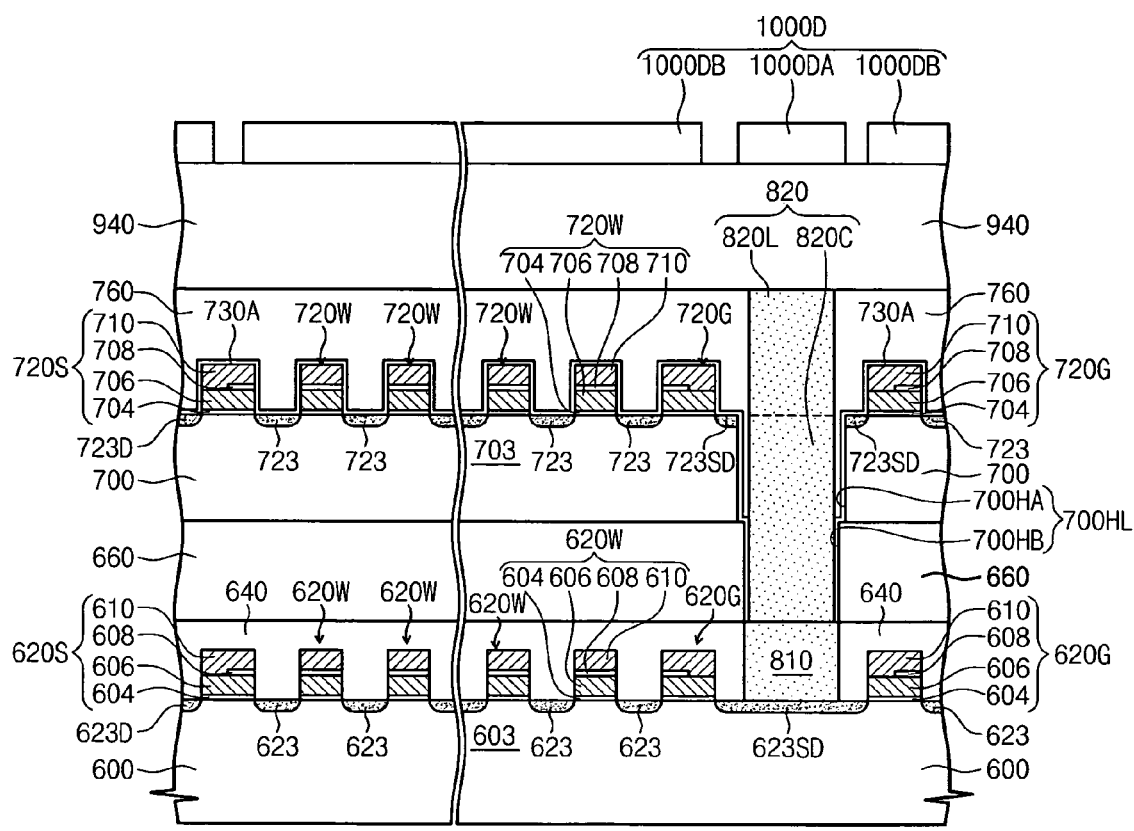
Figure 9A:
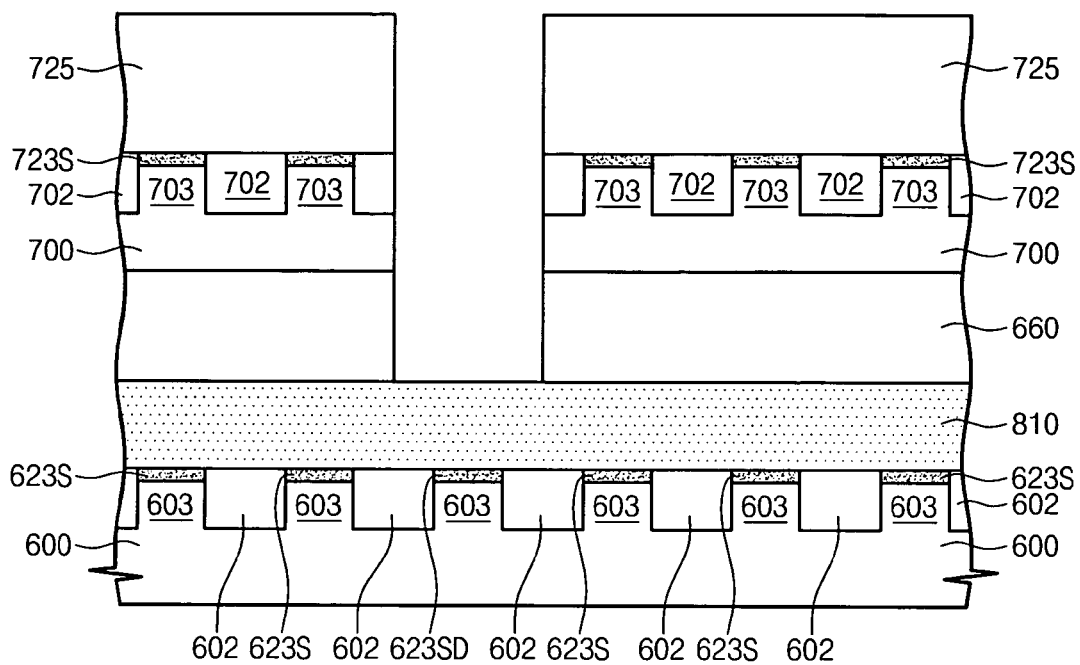
FIG. 9A through 9E illustrate cross sectional views along line II-II' of FIG. 6 to illustrate stages in a method of manufacturing a semiconductor device according to another embodiment of the present invention.
Figure 9B:
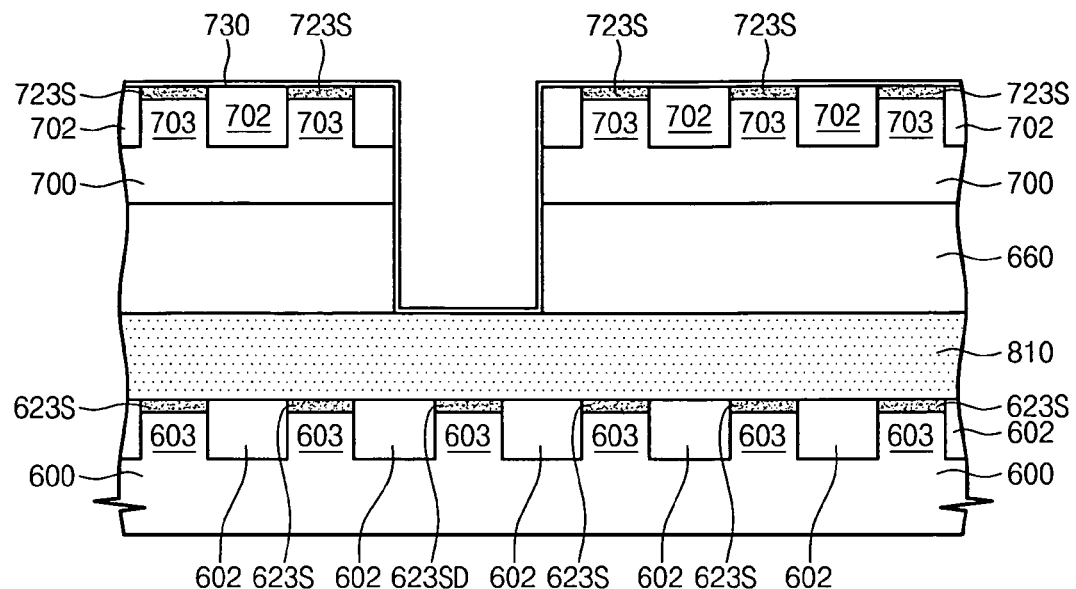
Figure 9C:
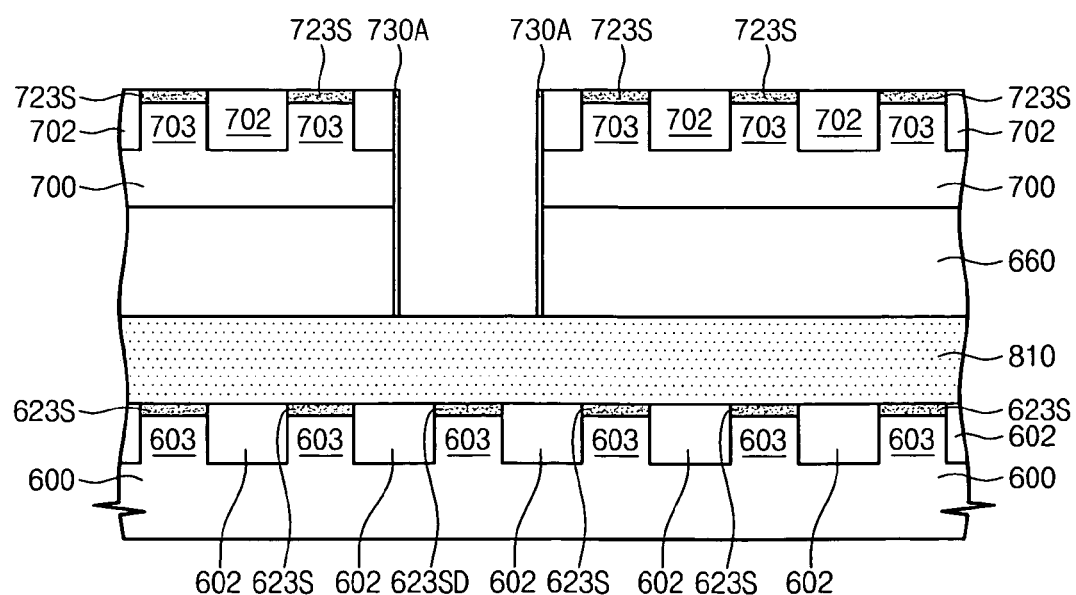
Figure 9D:
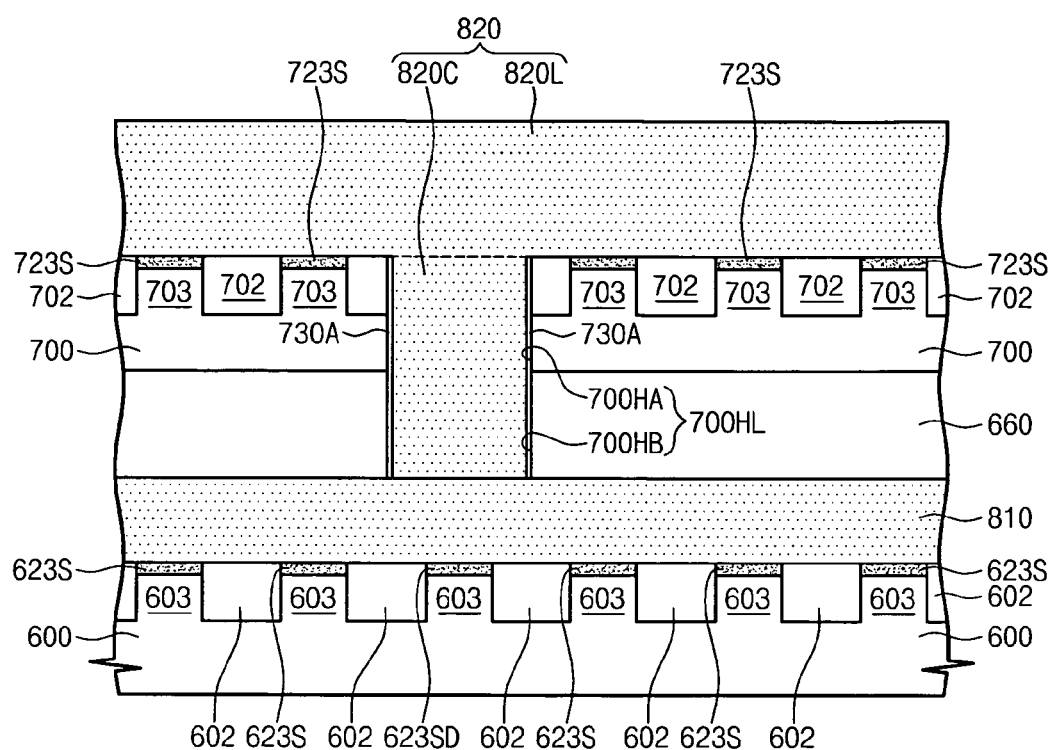
Figure 9E:
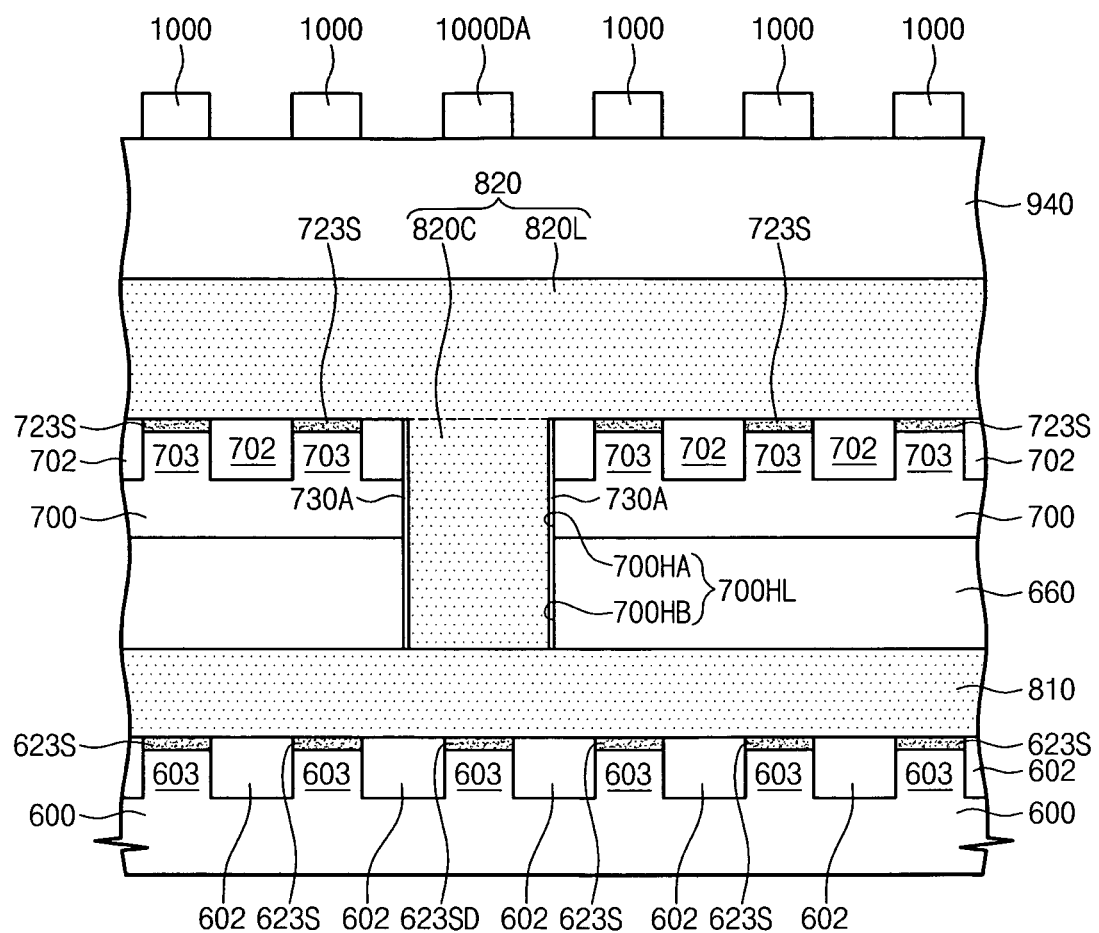
Figure 10A:
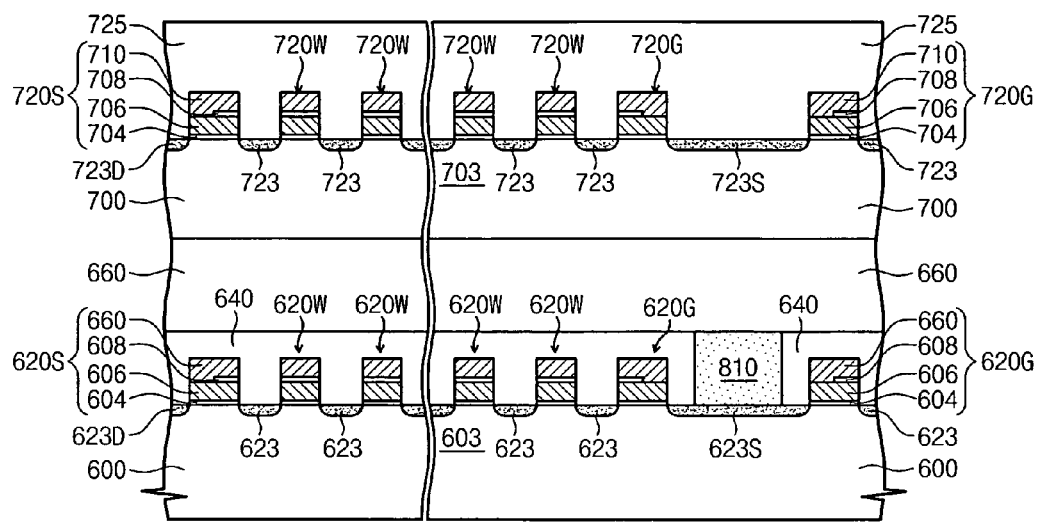
FIG. 10A through 10E illustrate cross sectional views along line III-III' of FIG. 6 to illustrate stages in a method of manufacturing a semiconductor device according to another embodiment of the present invention.
Figure 10B:
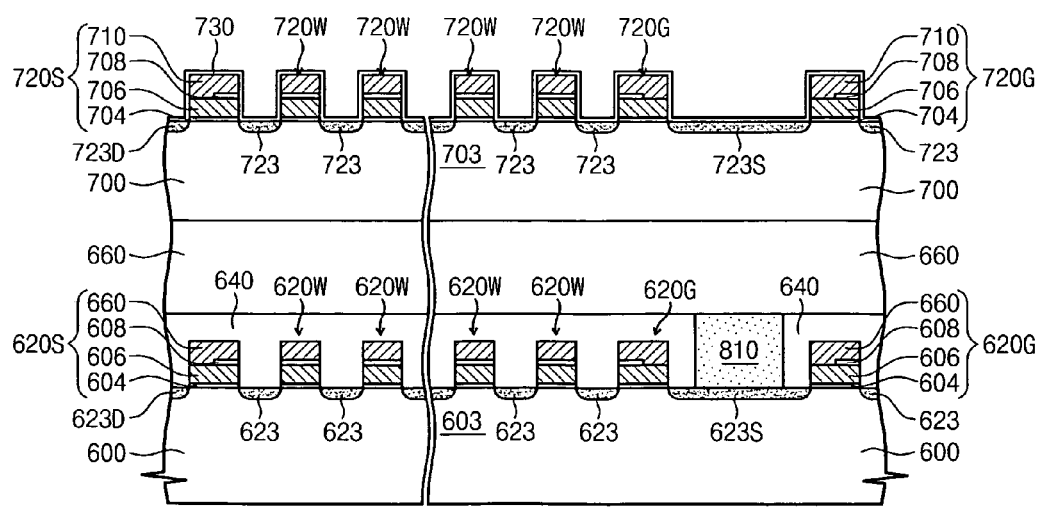
Figure 10C:
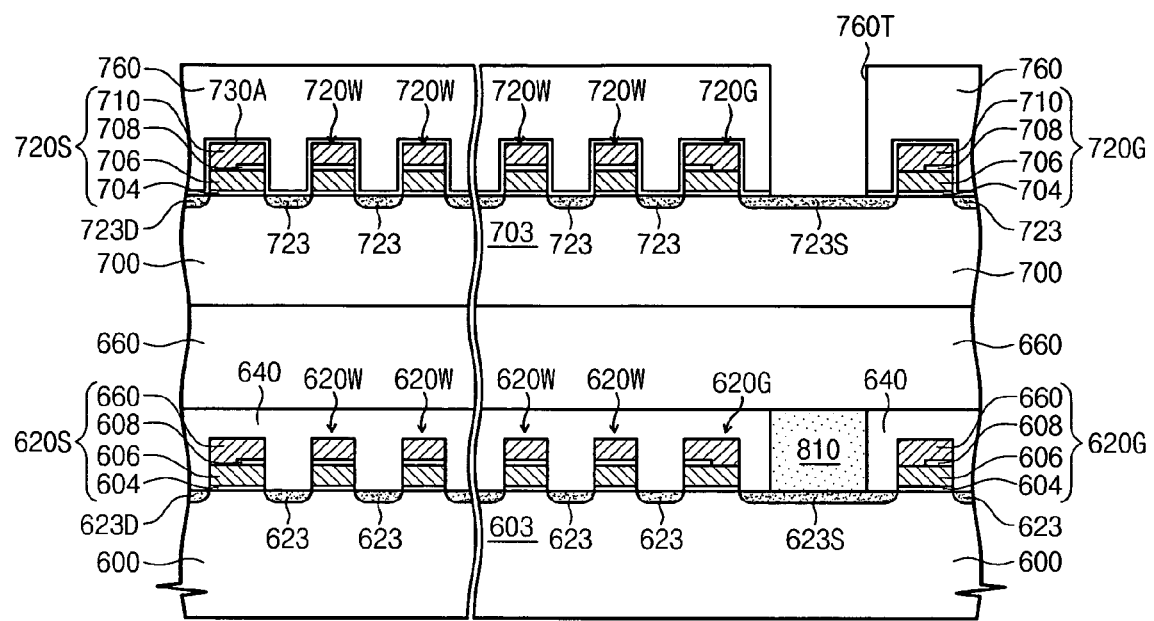
Figure 10D:
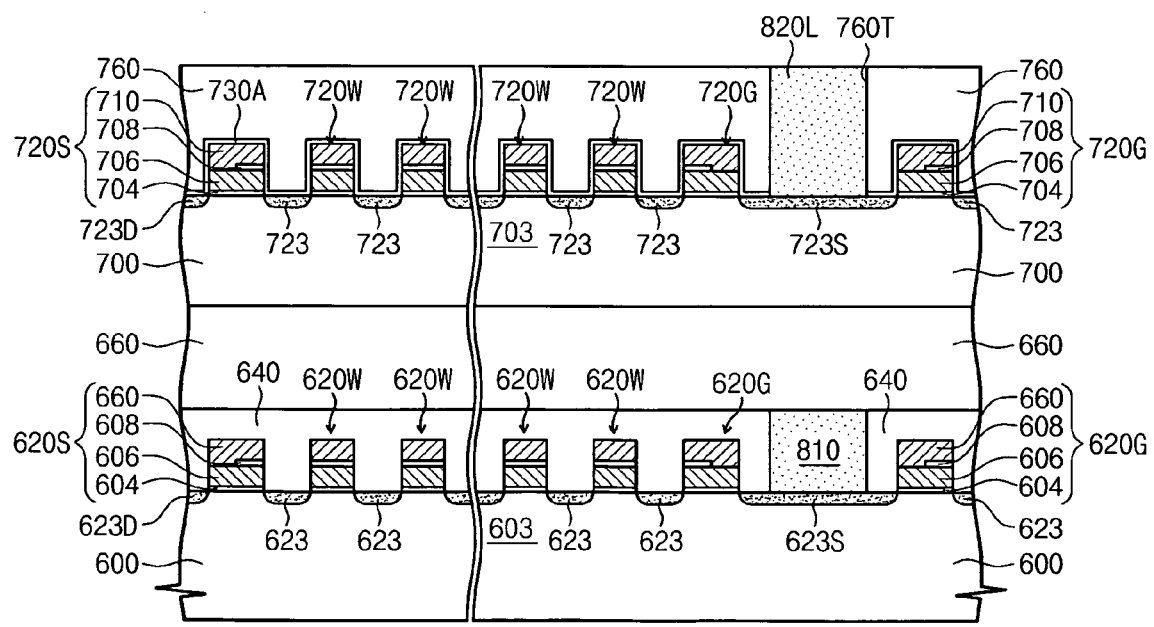
Figure 10E:
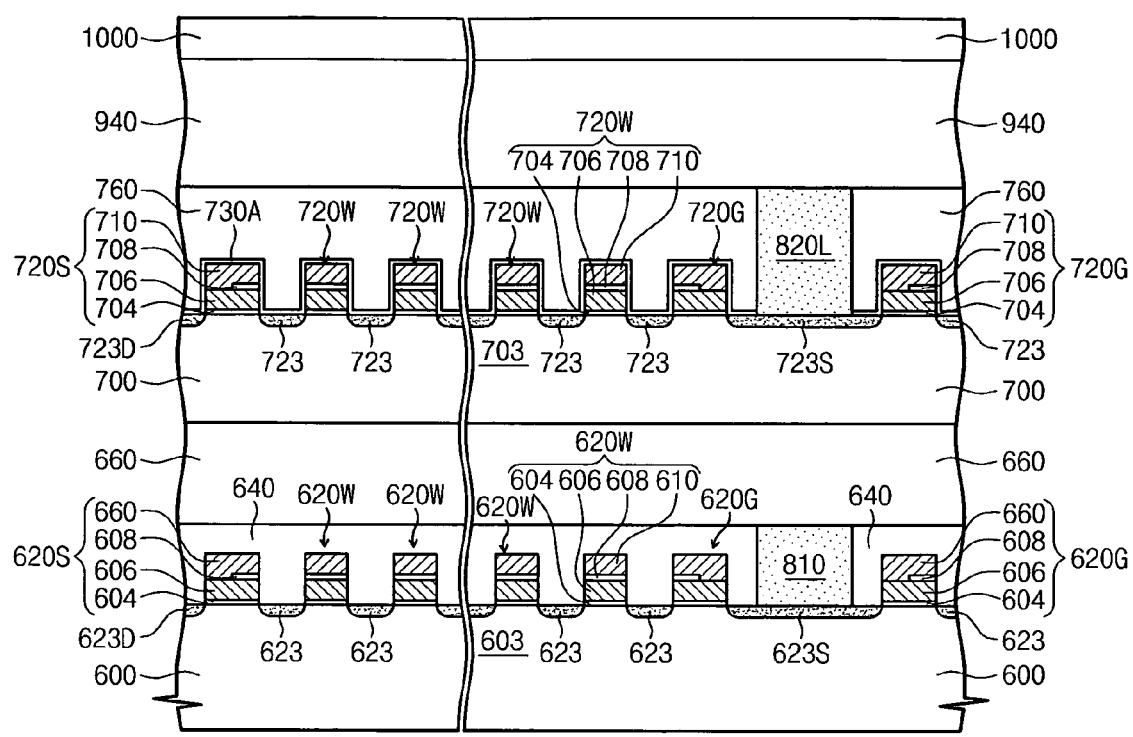

The upper common source line structure 820 in FIGS. 7A-7C may have the upper source line portion 820L and the conductive plug portion 820C as a single body, e.g., integral with each other. That is, since the upper common source line structure 820 has an equipotential, the upper common source line structure 820 may have a lower resistance as compared with the common source line structure of FIGS. 1-2C. In addition, the upper common source line structure 820 may not need a means for electrically being connected to the second source regions 723S. In other words, the upper source line portion 820L may be on, e.g., directly on, the second source regions 723S, so a height of a semiconductor device may be lowered, e.g., by a height of the second conductive plug 315C in FIGS. 2A-2C.

The lower common source line 810 and the upper common source line structure 820 may define a common source line structure.

A fourth interlayer insulating layer 840 may cover the third interlayer insulating layer 760 and a top surface of the upper common source line structure 820. Bit lines 1000 may be disposed on the fourth interlayer insulating layer 760 and cross the second gate lines 720S, 720W, and 720G. The bit lines 1000 may be substantially the same as the bit lines 500 of FIGS. 2A-2C and, therefore, will not be described in detail herein.

Referring to FIGS. 8A through 8E, 9A through 9E, and 10A through 10E, a method of manufacturing a semiconductor device according to another example embodiment will be described. The method of manufacturing a semiconductor device may be similar to the method described in FIGS. 3A-5F. Therefore, description of common features already discussed previously will be omitted for brevity.

Referring to FIGS. 6, 8A, 9A, and 10A, as described referring to FIGS. 1, 3C, 4C, and 5C, the first penetration hole 700HA revealing a portion of the first interlayer insulating layer 640 may be formed. The first penetration hole 700HA may penetrate the upper semiconductor layer 700 of the dummy second source region 723SD and the upper semiconductor layer 700 under the dummy second source region 723SD between the second ground selection line 720G and a different second ground selection line adjacent to the second ground selection line 720G. The first penetration hole 700HA may further penetrate a portion of the upper device isolation layer 702 adjacent to the dummy second source region 723SD and the upper semiconductor layer 700 under the portion of an upper device isolation layer 702. The first penetration hole 700HA may have a width smaller than a distance between the second ground selection line 720G and a different second ground selection line along a direction crossing a lengthwise direction of the second ground selection line 720G. The first penetration hole 700HA may have a width smaller than a distance between two source regions 723S adjacent to both sides of the dummy second source region 723SD along a direction parallel to a lengthwise direction of the second ground selection line 720G.

A mask layer 725 may be used to cover the second gate lines 720S, 720W, and 720G, and first penetration hole 700HA. The first interlayer insulating layer 640 may be patterned using the mask layer 725 to form a second penetration hole 700HB extended from the first penetration hole 700HA. For example, the second penetration hole 700HB may have a width smaller than the first penetration hole 700HA along a direction crossing a lengthwise direction of the second ground selection line 720G. In another example, the second penetration hole 700HB may be patterned to have the same width as the first penetration hole 700HA. The first penetration hole 700HA and the second penetration hole 700HB may define the extended penetration hole 700HL and may expose a portion of the lower common source line 810. A plurality of extended penetration holes 700HL may be disposed spaced apart from each other along a direction parallel to a lengthwise direction of the second ground selection line 720G. The mask layer 725 may be removed.

Referring to FIGS. 6, 8B, 9B, and 10B, an etching stop layer 730 may be deposited to conformally cover the second gate lines 720S, 720W, and 720G and the extended penetration hole 700HL. The etching stop layer 730 may be an insulating layer having an etching selectivity with respect to the upper device isolation layer 702. The etching stop layer 730 may be, e.g., a silicon nitride layer. The etching stop layer 730 may cover the top surface of the second source regions 723S and the top surface of the upper device isolation layer 702 between the second source regions 723S. The etching stop layer 730 may cover the top surface of an exposed lower common source line 810.

Referring to FIGS. 6, 8C, 9C, and 10C, the third interlayer insulating layer 760 having a complex trench 760T may cover the second gate lines 720S, 720W, and 720G, and may expose the etching stop layer 730 on a portion of the top surface of the second source regions 723S and on a portion of the top surface of the lower common source line 810. The complex trench 760T may extend along a direction parallel to a lengthwise direction of the second ground selection line 720G and may extend along the extended penetration hole 700HL.

The exposed etching stop layer 730 may be removed using the third interlayer insulating layer 760 as an etching mask to form an etching stop pattern 730A. Therefore, the top surfaces of the second source regions 723S, upper device isolation layer 702 between the second source regions 723S, and a portion of the top surface of the lower common source line 810 may be exposed.

Referring to FIGS. 6, 8D, 9D, and 10D, the complex trench 760T may be filled with a conductive material to form an upper common source line structure 820 that may be in contact with the top surface of the second source regions 723S and a portion of the top surface of the lower common source line 810. The upper common source line structure 820 may be electrically independent of the upper semiconductor layer 700 by the etch stop pattern 730A disposed between the upper common source line structure 820 and a sidewall of the first penetration hole 700HA and/or the third interlayer insulating layer 760. The upper common source line structure 820 may include polycrystalline silicon having an impurity of the same conductivity type as the lower conductive line 810. The upper common source line structure 820 may include at least one of tungsten, titanium, tantalum, a titanium nitride layer, a tantalum nitride layer, tungsten nitride layer, and combinations thereof.

The upper common source line structure 820 may have the upper source line portion 820L and the conductive plug portion 820C as a single body that may be formed by performing a process similar to a damascene process. Since the upper common source line structure 820 may have an equipotential, the upper common source line structure 820 may have a low resistance compared, e.g., with a connection of the upper common source line 320 of FIG. 2A to the first conductive plug 315D of FIG. 2A. In addition, the upper common source line structure 820 may not need a means, for example the second conductive plugs (315C in FIG. 2B) in the first embodiment of the present invention, for electrically being connected to the second source regions 723S. Thus, a manufacturing method may become simplified and a cost of manufacturing a semiconductor may be reduced. At a view point of vertical height, a height of a semiconductor device may be lowered as much as the second conductive plug. The lower common source line 810 and the upper common source line structure 820 may constitute a common source line structure.

Referring to FIGS. 6, 8E, 9E, and 10E, the fourth interlayer insulating layer 840 covering the third interlayer insulating layer 760 and the top surface of the upper common source line structure 820 may be formed. Bit lines 1000 may be disposed on the fourth interlayer insulating layer 760 and cross the second gate lines 720S, 720W, and 720G.

Referring to FIGS. 13, 14A, 14B, and 14C, a semiconductor device according to another embodiment will be described. The semiconductor device in FIGS. 13, 14A, 14B, and 14C may be substantially the same as the semiconductor device described previously with reference to FIGS. 1, 2A, 2B, and 2C, with the exception of including a penetration hole 200HP penetrating a pair of dummy second source regions 223SD. Description of common features discussed previously will be omitted for brevity.

Referring to FIGS. 13, 14A, 14B, and 14C, the upper semiconductor layer 200 may include the penetration hole 200HP penetrating a pair of dummy second source regions 223SD, and the upper device isolation layer 202 between the pair of dummy second source regions 223SD. The penetration hole 200HP may be disposed between a second ground selection line 220G and a different second ground selection line 220G adjacent to the second ground selection line 220G. The dummy first source regions 123SD and the dummy second source regions 223SD may be disposed to be adjacent to one another.

The penetration hole 200HP may penetrate a portion of the upper device isolation layer 202 adjacent to both sides of the pair of dummy second source regions 223SD and the underlying upper semiconductor layer 200. The penetration hole 200HP may have a width smaller than a distance between the second ground selection line 220G and a different ground selection line adjacent to the second ground selection line 220G. The penetration hole 200HP may have a width smaller than a distance between second source regions 223S most adjacent to both sides of the pair of dummy second source regions 223SD.

Two first conductive plugs 315D may be disposed to be spaced apart from each other between the upper common source line 320 and the lower common source line 310. Second conductive plugs 315C may be disposed to be spaced apart from one another between the upper common source line 320 and the second source regions. The two first conductive plugs 315D may penetrate the third interlayer insulating layer 240 to be in contact with a portion of the top surface of the upper common source line 320 and may penetrate the second interlayer insulating layer 160 to be in contact with a portion of the top surface of the lower common source line 310. The upper and lower common source lines 320 and 310 may be electrically connected to each other through the first conductive plugs 315D.

The penetration hole 200HP may have a wide width compared with the penetration hole 200H of FIG. 1. Because a cross sectional area of the penetration hole 200HP may be wide, a plurality of the first conductive plugs 315D may be disposed in one penetration hole 200HP or a cross sectional area, i.e., width along the second horizontal direction, of the first conductive plug 315D may be increased. An electrical contact between the upper and lower common source lines 320 and 310 may be improved through the first conductive plug 315D.

Referring to FIGS. 15, 16A, 16B, and 16C, a semiconductor device according to another example embodiment will be described. The semiconductor device in FIGS. 15, 16A, 16B, and 16C may be substantially the same as the semiconductor device described previously with reference to FIGS. 6, 7A, 7B, and 7C, with the exception of including a first penetration hole 700HA penetrating a pair of dummy second source regions 723SD and a second penetration hole 700HB extending from the first penetration hole 700HA. Description of common features discussed previously will be omitted for brevity.

Referring to FIGS. 15, 16A, 16B and 16C, the upper semiconductor layer 700 may include the first penetration hole 700HA penetrating a pair of dummy second source regions 723SD, and the upper device isolation layer 702 between the pair of dummy second source regions 723SD. The first penetration hole 700HA may be disposed between a second ground selection line 720G and a different second ground selection line adjacent to the second ground selection line 720G. The dummy first source regions 623SD and the dummy second source regions 723SD may be formed to be adjacent to one another.

The first penetration hole 700HA may penetrate a portion of the upper device isolation layer 702 adjacent to both sides of the pair of the dummy second source regions 723SD. The first penetration hole 700HA may have a width smaller than a distance between a second ground selection line 720G and a different second ground selection line 720G. The first penetration hole 700HA may have a width smaller than a distance between two source regions most adjacent to both sides of a pair of dummy second source regions 723SD.

The second penetration hole 700HB may extend from the first penetration hole 700HA and may penetrate the second interlayer insulating layer 660. The second penetration hole 700HB may have a width equal to or smaller than the first penetration hole 700HA. The first and second penetration holes 700HA and 700HB may define an extended penetration hole 700HP. Plurality of extended penetration holes 700HP may be disposed to be spaced apart from one another along a direction parallel to a lengthwise direction of the second ground selection line 720G.

An etching stop pattern 730B may conformally cover second gate lines 720S, 720W, and 720G, second conductive regions 723D, 723, and 723S, and a sidewall of the extended penetration hole 700HP. The etching stop pattern 730B may be, e.g., a silicon nitride layer. The etching stop pattern 730B may expose the top surfaces of the second source regions 723S and upper device isolation 702 between the second source regions 723S. The etching stop pattern 730B may expose a portion of the top surface of the lower common source line 810P corresponding to a cross sectional area of the extended penetration hole 700HP. A cross sectional area of the extended penetration hole 700HP may be an area taken along a width of the extended penetration hole 700HP.

The third interlayer insulating layer 760 may cover the second gate lines 720S, 720W, and 720G including the etching stop pattern 730B, and may expose the top surfaces of the second source regions 723S and upper device isolation layer 702 between the second source regions 723S along a direction parallel to a lengthwise direction of the second ground selection line 720G. The third interlayer insulating layer 760 may have the complex trench 760TP exposing a portion of the top surface of the lower common source line 810 along the extended penetration hole 700HP.

The complex trench 760T may be filled with the upper common source line structure 820P. The upper common source line structure 820P may include the upper source line portion 820LP in contact with the top surfaces of the second source regions 723S, and the conductive plug portion 820CP in contact with a portion of the top surface of the lower common source line 810.

Figure 6:
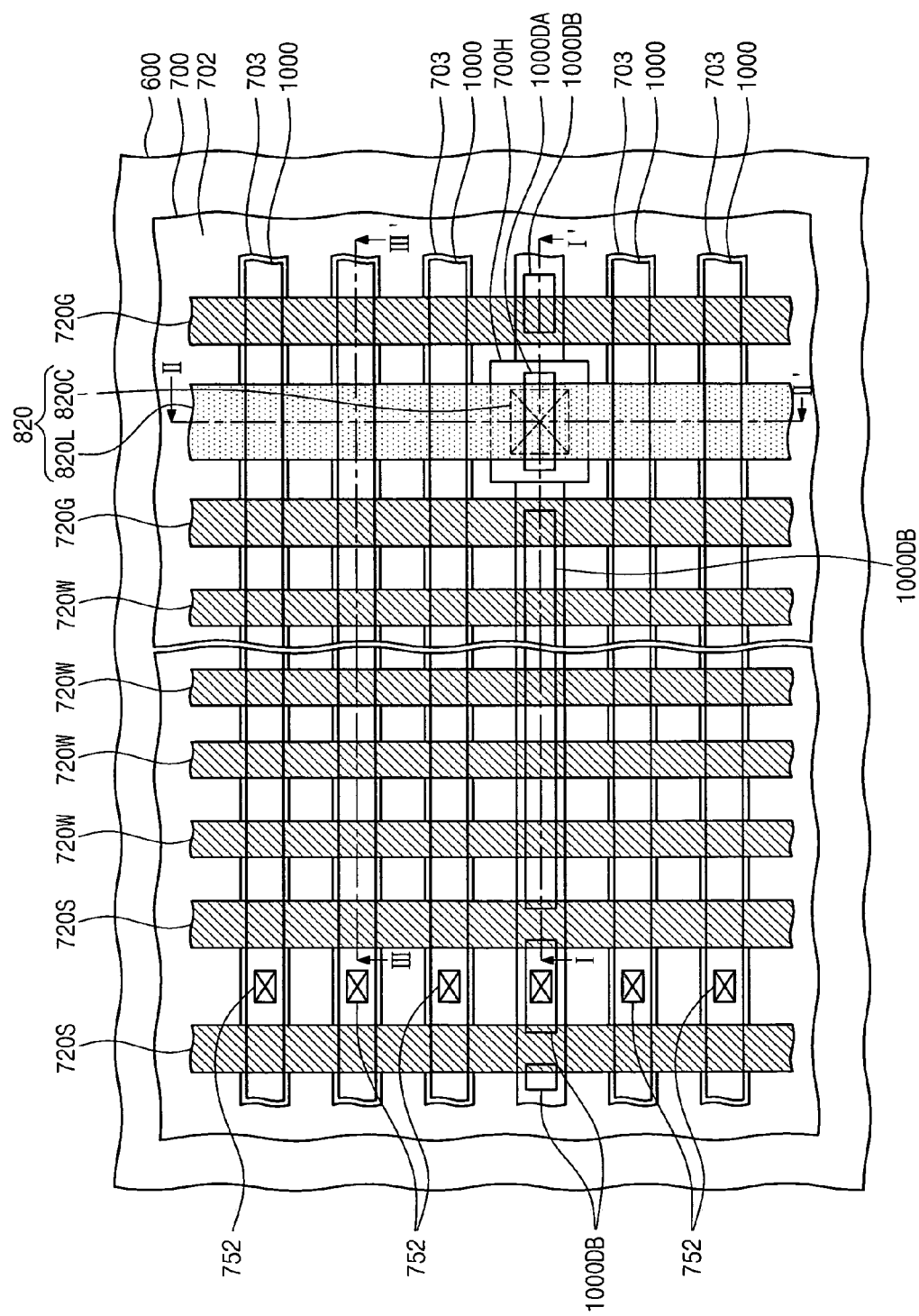
FIG. 6 illustrates a top plan view of a semiconductor device according to another embodiment of the present invention.

The penetration hole 700HP may have a wide width compared with the extended penetration hole 700HL of FIG. 6. Since a cross sectional area of the extended penetration hole 700HP may be wide, a cross sectional area of the conductive plug 820CP of the upper source line structure 820P may be widened. An electrical contact between the upper source line structure 820P and the lower common source line 810 may be improved through the conductive plug 820CP.

Figure 17:
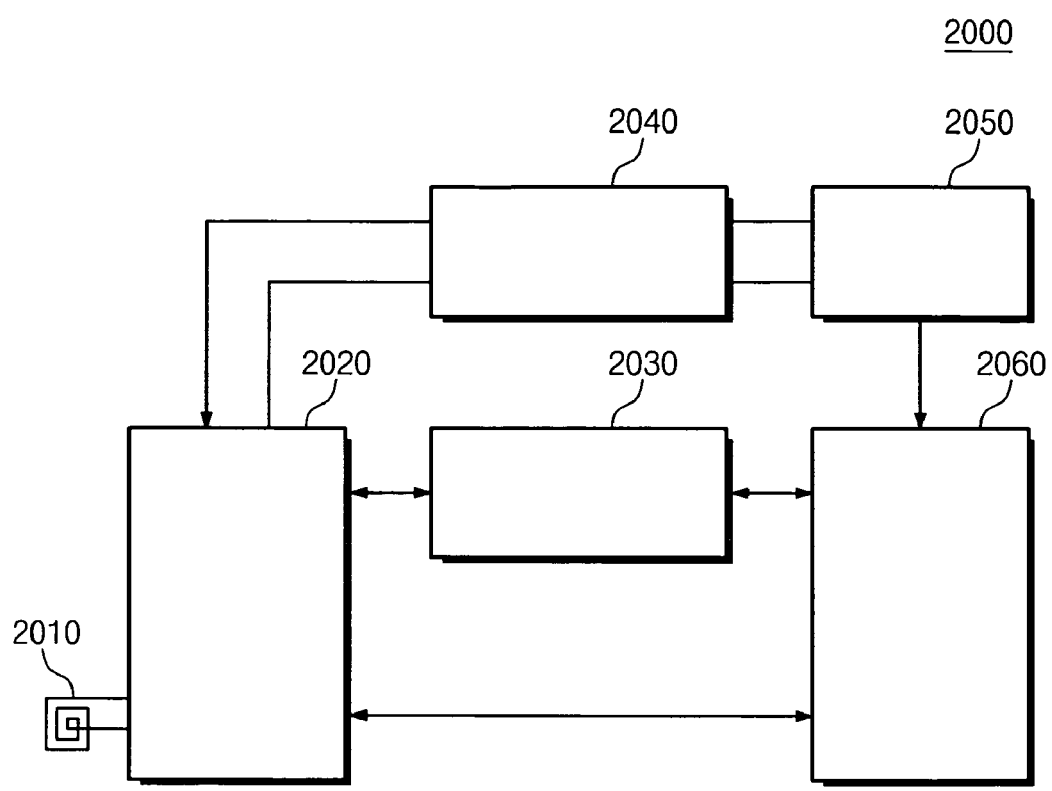
FIG. 17 illustrates a block diagram of an electrical device system including a semiconductor device according to the present invention.

FIG. 17 illustrates a block diagram of an electrical device system including a semiconductor device according to example embodiments.

Referring to FIG. 17, an electronic device according to embodiments may include a mobile communication terminal 2000 having a radio frequency communication chip 2020, a smart card 2030, a switching circuit 2040, a battery 2050, and a controller 2060. The mobile communication terminal 2000 may include a semiconductor device according to example embodiments. That is, the mobile communication terminal 2000 may include a highly integrated semiconductor device of multilayer structure which includes a common source line structure having a relatively low resistance.

A semiconductor device according to example embodiments may be manufactured of a memory chip. For example, the radio frequency communication chip 2020 may include a processor and a memory chip, the smart card 2030 may include a memory chip, and the controller 2060 may include a logic chip.

The radio frequency communication chip 2020 may receive a radio frequency signal from an external RFID recognizer (not shown) and/or transmit a radio frequency signal to the external RFID recognizer (not shown) through an antenna 2010. The radio frequency communication chip 2020 may transmit a signal provided from the smart card 2030 or the controller 2060 to the RFID recognizer, and may transmit a signal received from the RFID recognizer through the antenna 2010 to the smart card 2030 or the controller 2060. The smart card 2030 may communicate with the radio frequency communication chip 2020 and the controller 2060. The battery 2050 may provide a supply needed in the mobile communication terminal 2000. The controller 2060 may control overall operations.

An electronic device including a semiconductor device according to example embodiments may include various mobile devices, e.g., a personal digital assistant (PDA), a MP3 player, a movie regenerator and a portable game, a desk top computer, a large size computer, a global position system (GPS), a PC card, a notebook computer, a camcorder, and a digital camera besides the mobile communication terminal 2000.

Exemplary embodiments have been disclosed herein, and although specific terms may be employed, they may be used and may be to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
a lower semiconductor layer with first conductive regions, the first conductive regions including at least one dummy first conductive region;
an upper semiconductor layer with second conductive regions on the lower semiconductor layer, the second conductive regions including at least one dummy second conductive region;
a penetration hole in the upper semiconductor layer, the penetration hole penetrating the dummy second conductive region and the upper semiconductor layer under the dummy second conductive region;
a lower conductive line on the lower semiconductor layer, the lower conductive line being electrically connected to the first conductive regions;
an upper conductive line on the upper semiconductor layer, the upper conductive line being electrically connected to the second conductive regions;
a first conductive plug in the penetration hole between the lower conductive line and the upper conductive line, the first conductive plug electrically connecting the lower conductive line to the upper conductive line, and the first conductive plug being spaced apart from sidewalls of the penetration hole;
a device isolation layer in the upper semiconductor layer, the device isolation layer separating each of the second conductive regions;
first gate lines on the lower semiconductor layer on both sides of the lower conductive line; and
second gate lines along a first direction on the upper semiconductor layer on both sides of the upper conductive line, the second gate lines being spaced apart from each other along a second direction,
wherein the penetration hole penetrates a portion of the device isolation layer at both sides of the dummy second conductive region and the upper semiconductor layer under the portion of the device isolation layer.

2. The semiconductor device as claimed in claim 1, wherein the penetration hole is between two gate lines adjacent to each other along the second direction, the penetration hole having a width along the second direction smaller than a distance between the two adjacent gate lines.

3. The semiconductor device as claimed in claim 2, wherein the penetration hole is between two second conductive regions adjacent to each other along the first direction, the penetration hole having a width along the first direction smaller than a distance between the two adjacent second conductive regions.

4. The semiconductor device as claimed in claim 1, further comprising:
second conductive plugs between the upper conductive line and the second conductive regions; and
an interlayer insulating layer between the upper semiconductor layer and the lower semiconductor layer, the interlayer insulating layer having an extension hole extending from the penetration hole and penetrating at least a portion of the interlayer insulating layer.

5. The semiconductor device as claimed in claim 4, wherein the penetration hole is wider than the extension hole.

6. The semiconductor device as claimed in claim 4, wherein the first conductive plug fills the penetration hole and the extension hole to contact a portion of the lower conductive line, the upper conductive line being in contact with a top surface of the second conductive regions, and the upper conductive line and the first conductive plug being integral with each other.

7. The semiconductor device as claimed in claim 6, further comprising an etching stop pattern disposed between the first conductive plug and the sidewall of the penetration hole.

8. The semiconductor device as claimed in claim 1, wherein a plurality of dummy first conductive regions is disposed adjacent to one another along the first direction, and a plurality of the dummy second conductive regions is disposed adjacent to one another along the first direction.

9. The semiconductor device as claimed in claim 8, wherein the penetration hole penetrates a dummy second conductive region and a portion of a device isolation layer, the portion of the device isolation layer being between two adjacent second conductive regions.

10. The semiconductor device as claimed in claim 9, wherein the penetration hole penetrates a portion of the device isolation layer adjacent to both outermost sides of the adjacent dummy second conductive regions and the upper semiconductor layer under the portion of the device isolation layer.

11. The semiconductor device as claimed in claim 1, further comprising a plurality of first conductive plugs in the penetration hole, the plurality of the first conductive plugs being spaced apart from each other along a first direction.

12. The semiconductor device as claimed in claim 1, wherein the penetration hole, upper conductive line, and lower conductive line overlap.

13. The semiconductor device as claimed in claim 1, wherein a width of the first conductive plug is smaller than a width of the penetration hole, the first conductive plug being centered in the penetration hole.

14. The semiconductor device as claimed in claim 1, wherein the first conductive plug contacts the upper and lower conductive lines, the upper conductive line and the first conductive plug being equipotential.

* * * * *